(12) United States Patent
Mirichigni et al.

(10) Patent No.: US 10,600,480 B2
(45) Date of Patent: Mar. 24, 2020

(54) AUTO-REFERENCED MEMORY CELL READ TECHNIQUES

(71) Applicant: Micron Technology, Inc., Boise, ID (US)

(72) Inventors: Graziano Mirichigni, Vimercate (IT); Paolo Amato, Treviglio (IT); Federico Pio, Brugherio (IT); Alessandro Orlando, Naples (IT); Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/536,120

(22) Filed: Aug. 8, 2019

(65) Prior Publication Data

US 2020/0035297 A1 Jan. 30, 2020

Related U.S. Application Data

(62) Division of application No. 15/853,364, filed on Dec. 22, 2017, now Pat. No. 10,431,301.

(51) Int. Cl.
*G11C 7/10* (2006.01)
*G11C 13/00* (2006.01)
(Continued)

(52) U.S. Cl.
CPC ........ *G11C 13/004* (2013.01); *G11C 11/5678* (2013.01); *G11C 13/003* (2013.01);
(Continued)

(58) Field of Classification Search
CPC .................................................. G11C 7/1006
(Continued)

(56) References Cited

U.S. PATENT DOCUMENTS 7,054,197 B2  5/2006 Vimercati
7,321,512 B2  1/2008 Vimercati et al.
(Continued)

FOREIGN PATENT DOCUMENTS

WO   2013033375 A1   3/2013

OTHER PUBLICATIONS

IPO, "Office Action," issued in connection with ROC (Taiwan) Pat. App. No. 107146309, dated Jul. 11, 2019 (6 pages).
(Continued)

*Primary Examiner* — Jason Lappas
(74) *Attorney, Agent, or Firm* — Holland & Hart LLP

(57) ABSTRACT

Methods, systems, and devices related to auto-referenced memory cell read techniques are described. The auto-referenced read may encode user data to include a predetermined number of bits having a first logic state prior to storing the user data in memory cells. The auto-referenced read may store a total number of bits of the user data having a first logic state in a separate set of memory cells. Subsequently, reading the user data may be carried out by applying a read voltage to the memory cells storing the user data while monitoring a series of switching events by activating a subset of the memory cells having the first logic state. During the read operation, the auto-referenced read may compare the number of activated memory cells to either the predetermined number or the total number to determine whether all the bits having the first logic state has been detected. When the number of activated memory cells matches either the predetermined number or the total number, the auto-referenced read may determine that the memory cells that have been activated correspond to the first logic state.

20 Claims, 11 Drawing Sheets

(51) Int. Cl.
*G11C 11/56* (2006.01)
*H01L 45/00* (2006.01)
*H01L 27/24* (2006.01)
*G11C 7/06* (2006.01)

(52) U.S. Cl.
CPC ...... *G11C 13/0004* (2013.01); *H01L 27/2481* (2013.01); *H01L 45/06* (2013.01); *G11C 7/06* (2013.01); *G11C 7/1006* (2013.01); *G11C 2213/0054* (2013.01); *G11C 2213/71* (2013.01); *G11C 2213/72* (2013.01); *G11C 2213/76* (2013.01)

(58) Field of Classification Search
USPC ................... 365/189.07, 189.15; 714/720
See application file for complete search history.

(56) References Cited

U.S. PATENT DOCUMENTS

| | | | |
|---|---|---|---|
| 7,345,905 | B2 | 3/2008 | Pio et al. |
| 7,554,861 | B2 | 6/2009 | Vimercati et al. |
| 8,767,482 | B2 | 7/2014 | Hirst et al. |
| 9,164,881 | B2 | 10/2015 | Seol et al. |
| 9,460,784 | B1 | 10/2016 | Pellizzer |
| 2004/0190348 | A1 | 9/2004 | Cioaca et al. |
| 2005/0063218 | A1 | 3/2005 | Roohparvar |
| 2005/0078513 | A1 | 4/2005 | Tatsukawa et al. |
| 2006/0155882 | A1 | 7/2006 | Jochemsen et al. |
| 2011/0214025 | A1* | 9/2011 | Seko ............... G11C 13/0004 714/720 |
| 2013/0167251 | A1 | 6/2013 | Pio |
| 2014/0173180 | A1 | 6/2014 | D'Abreu et al. |
| 2016/0259683 | A1 | 9/2016 | Sakurada |
| 2017/0125097 | A1 | 5/2017 | Tortorelli et al. |
| 2017/0263304 | A1 | 9/2017 | Vimercati |
| 2017/0287541 | A1 | 10/2017 | Vimercati |
| 2017/0358338 | A1 | 12/2017 | Derner et al. |

OTHER PUBLICATIONS

ISA/KR, International Search Report and Written Opinion of the International Searching Authority, Int'l. Appl. No. PCT/US2018/066653, dated Jun. 7, 2019, Korean Intellectual Property Office, Seo-gu, Daejeon, Republic of Korea,15 pgs.

ISA/KR, International Search Report and Written Opinion of the International Searching Authority, Int'l. Appl. No. PCT/US2018/067287, dated Apr. 12, 2019, Korean Intellectual Property Office, Seo-gu, Daejeon, Republic of Korea,12 pgs.

U.S. Appl. No. 15/619,158, filed Jun. 9, 2017.

U.S. Appl. No. 15/619,163, filed Jun. 9, 2017.

Vimercati, et al., "A 125MHz Burst-Mode Flexible Read-While-Write 256Mbit 2b/c 1.8V NOR Flash Memory", IEEE International Solid-State Circuits Conference, Digest of Technical Papers, Feb. 7, 2005, (c) IEEE., 3pgs.

* cited by examiner

AUTO-REFERENCED MEMORY CELL READ TECHNIQUES

CROSS REFERENCE

The present Application for Patent is a divisional of U.S. patent application Ser. No. 15/853,364 by Mirichigni et al., entitled "Auto-Referenced Memory Cell Read Techniques," filed Dec. 22, 2017, now U.S. Pat. No. 10,431,301, assigned to the assignee hereof, and is expressly incorporated by reference in its entirety herein.

BACKGROUND

The following relates generally to operating a memory array and more specifically to auto-referenced memory cell read techniques.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. A more robust read technique may be desired to increase memory cell performance and reliability when memory cells exhibit variable electrical characteristics.

DETAILED DESCRIPTION

Figure 1:
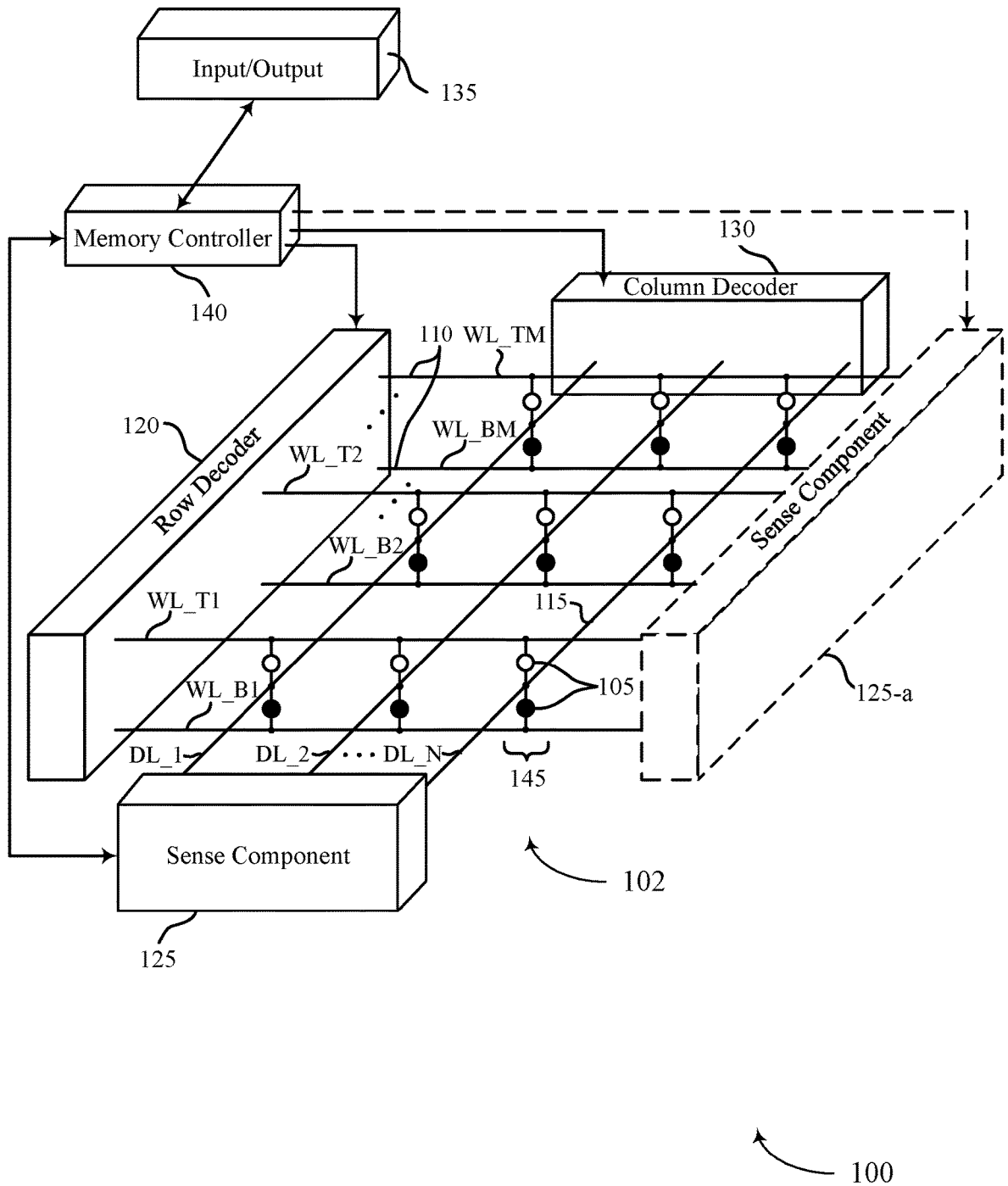
FIG. 1 illustrates an example of a memory device diagram having a three-dimensional (3D) array of memory cells that supports auto-referenced memory cell read techniques in accordance with embodiments of the present disclosure.

In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others. Auto-referenced memory cell read techniques of the present disclosure may provide a reliable and robust read technique in which reading a set of user data (e.g., a codeword, a page) is carried out by tracking a number of memory cells activated in response to a read voltage applied to the memory cells. In some instances, the auto-referenced read may use a predetermined number to decide whether the memory cells associated with a first logic state have been accounted for while reading the user data. Further, the auto-referenced read may determine a total number of memory cells associated with the first logic state while reading the user data.

In some aspects, the auto-referenced read techniques reduces or eliminates a separate set of read-reference memory cells that may be present in a memory device. The read-reference memory cells may not possess common electrical characteristics with a majority of memory cells in which user data are stored due to various reasons, such as different process conditions (e.g., a non-uniform loading pattern of a plasma density) during fabrication process steps, a different cycling events, among others. Hence, the separate set of read-reference memory cells may not provide a reliable referencing scheme during a read operation.

The auto-referenced read techniques may include an encoding scheme to apply to user data to establish a predetermined number of bits in encoded user data to have a given logic state (e.g., a logic state of 1) prior to storing the encoded user data in memory cells. The encoding scheme may include adding a number of extra bits (which may also be referred to as parity bits) to the user data during the encoding process. In some embodiments, the auto-referenced read may use a different encoding scheme that stores a counting information corresponding to a total number of bits in the user data having a given logic state (e.g., a logic state of 1) in a number of memory cells when storing the user data. In some cases, the counting information may be stored as a binary number that represent the total number of bits in the user data having the given logic state. In other cases, the counting information may be encoded to have a weight pattern of a given weight (e.g., 20%, 30%, 50% (i.e., one-half of the memory cells storing the counting information have the given logic state), 75%).

In some aspects, a memory device may include an array of PCM cells arranged in a 3D architecture, such as 3D XPoint™ memory to store user data. PCM cells in 3D XPoint™ architecture (which may also be referred to as 3DXP memory cells) may represent a first logic state (e.g., a logic state of 1) associated with a first set of threshold voltages or a second logic state (e.g., a logic state of 0) associated with a second set of threshold voltages. In some embodiments, a logic state of 1 (e.g., a SET state of a PCM cell, which may also be referred to as a SET cell or bit)

corresponds to a set of threshold voltages lower than a set of threshold voltages associated with a logic state of 0 (e.g., a RESET state of a PCM cell, which may also be referred to as a RESET cell or bit).

The auto-referenced read techniques may include application of a voltage (e.g., a read voltage) to a memory array that is configured to activate a group of memory cells containing encoded user data. The voltage may increase as a function of time with a constant rate of change. In some cases, the read voltage has a monotonically increasing staircase shape such that a first voltage is applied for a first period of time followed by a second different voltage for a second period of time. The applied read voltage may initiate a series of switching events by activating the group of memory cells storing the encoded user data. The switching event may be attributed to a memory cell turning on (e.g., conducting an appreciable amount of current) when the applied voltage across the memory cell exceeds its threshold voltage. The auto-referenced read techniques may track a number of memory cells turning on (e.g., activating) in response to the read voltage.

When the user data have been encoded with a predetermined number of memory cells to have a first logic state (e.g., a logic state of 1), the auto-referenced read techniques may compare the number of activated memory cells with the predetermined number stored in a memory device. When the number of activated memory cells is less than the predetermined number, the auto-referenced read techniques may continue to apply (e.g., increase) the read voltage to the memory array while tracking additional memory cells that are activated (e.g., until the number of activated memory cells matches the predetermined number). When the number of activated memory cells matches the predetermined number, the auto-referenced read may stop applying the read voltage to the memory array and make a determination that all the activated memory cells of the encoded user data has the first logic state. Further, the auto-referenced read may determine that remaining memory cells of the encoded user data (e.g., the inactive memory cells when the number of activated memory cells matches the predetermined number) have a second logic state (e.g., a logic state of 0).

When the user data have been encoded with an additional set of memory cells that stores counting information corresponding to a total number of bits in the user data having a first logic state (e.g., a logic state of 1), the auto-referenced read techniques may read the counting information from the additional set of memory cells to identify the total number. The total number may be stored in a memory device to provide a criterion as to whether a read voltage may continue or stop while tracking a number of activated memory cells of the user data in response to the read voltage. When the number of activated memory cells is less than the total number, the auto-referenced read techniques may continue to apply (e.g., increase) the read voltage to the memory array while tracking additional memory cells that are activated until the number of activated memory cells matches the total number. When the number of activated memory cells of the user data matches the total number, the auto-referenced read techniques may stop applying the read voltage to the memory array and determine that all the activated memory cells of the user data has the first logic state (e.g., SET or RESET cells). Additionally, the auto-referenced read techniques may determine that remaining memory cells of the user data (e.g., the inactive memory cells when the number of activated memory cells matches the predetermined number) have a second logic state (e.g., SET or RESET cells).

In some cases, the counting information is encoded to have a fixed number of bits of a first logic state (e.g., a logic state of 1) prior to being stored in the additional set of memory cells. As an example, one-half of the additional set of memory cells may be configured to have the logic state of 1 to represent the count information. During a read operation, the auto-referenced read may track a number of activated memory cells of the additional set of memory cells to determine if all the memory cells of the additional set of memory cells having the logic state of 1 are accounted for. When all the memory cells of the additional set of memory cells has been accounted for (e.g., activated), the auto-referenced read techniques may set a flag in a memory device and extract the counting information from the additional set of memory cells. The counting information may be stored in a register in the memory device and the flag may indicate that the counting information in the register is a valid representation (e.g., in binary format) of a total number of bits in the user data exhibiting a first logic state (e.g., a logic state of 1). The counting information in the register may then be used to track a number of memory cells activated in the user data in a similar manner described above. In some embodiments, a different read voltage may be applied to the additional set of memory cells compared to the memory cells storing the user data. Additionally or alternatively, a single read voltage may be applied to both the additional set of memory cells and the memory cells storing the user data.

Features of the disclosure introduced above are further described below in the context of a memory array in a memory device. Specific non-limiting examples are then described for illustrating various features of the auto-referenced memory cell read techniques in accordance with some embodiments (e.g., the memory array including PCM cells or 3DXP memory cells). These and other features of the disclosure are further illustrated by and described with reference to apparatus diagrams, system diagrams, and flowcharts that relate to auto-referenced memory cell read techniques. As a person of ordinary skill in the art would appreciate, however, other alternatives and different variations may be considered and fall within the scope of this disclosure.

FIG. 1 illustrates an example memory device 100 in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, and may not be representative of their actual physical positions within the memory device 100. In the illustrative example of FIG. 1, the memory device 100 includes a 3D memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a PCM cell (e.g., a 3DXP memory cell). Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays formed adjacent one another (e.g., on top of or next to one another). This may increase a number of memory cells 105 that may be placed or created on a single die or substrate as compared with 2D arrays, which in turn may reduce production costs, or increase the performance of the memory device, or both. Based on the example depicted in FIG. 1, the 3D memory array 102 includes two levels of memory cells 105; however, the number of levels may not be limited to two. Each level may be aligned or positioned such that memory cells 105 may be aligned (exactly, overlapping, or approximately) with one another across each level, forming a memory cell stack 145. In some cases, the memory cell stack 145 may include a PCM cell (e.g., 3DXP memory cell) laid on top of another.

In some embodiments, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. In other embodiments, each of the memory cell 105 (e.g., the upper memory cell, the lower memory cell) may be configured with its own bit line. In such cases, the memory cells may be separated by an insulation layer. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

Figure 2:
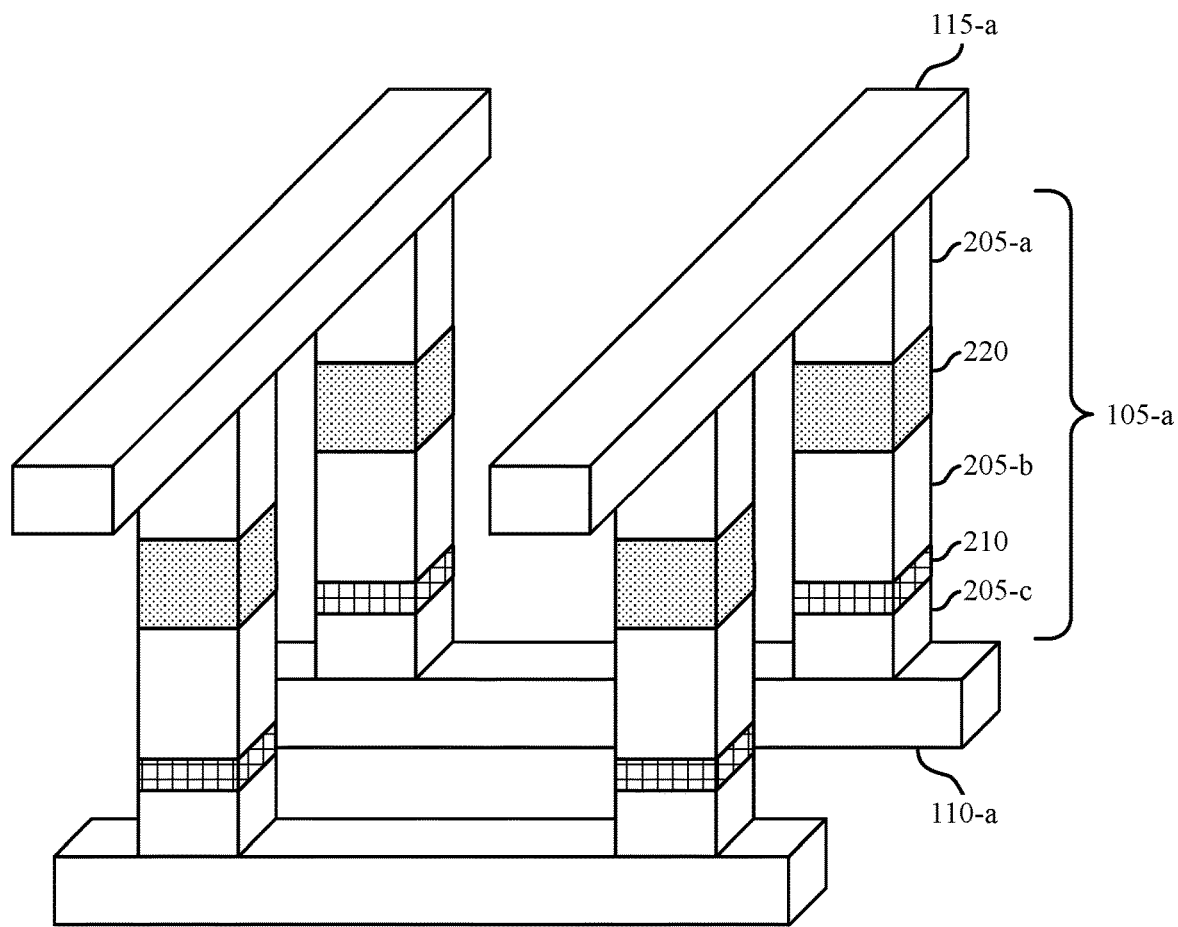
FIG. 2 illustrates an example of a 3D memory array that supports auto-referenced memory cell read techniques in accordance with embodiments of the present disclosure.
Figure 2:
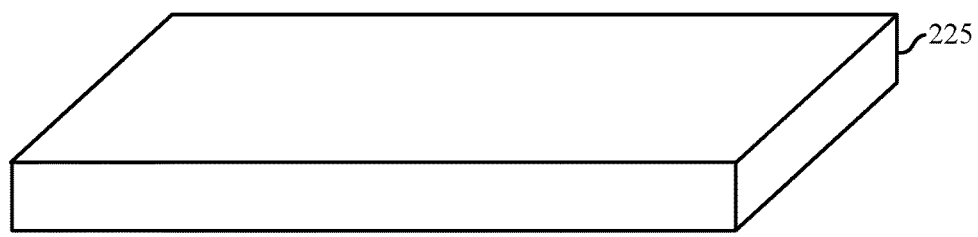
Figure 2:

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide alloy positioned between a first electrode and a second electrode. One side of the first electrode may be coupled to an access line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different. In other embodiments, the memory cell 105 may include an additional electrode to separate the chalcogenide alloy into two parts as depicted in FIG. 2. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

Operations such as reading and writing may be performed on memory cells 105 by energizing or selecting access line 110 and digit line 115. In some embodiments, access lines 110 may also be known as word lines 110, and bit lines 115 may also be known as digit lines 115. References to word lines and bit lines, or their analogues, are interchangeable without loss of understanding or operation. Energizing or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a memory cell 105 (e.g., a capacitor, a resistor) may be electrically isolated from the digit line 115 by a selection component. The word line 110 may be connected to and may control the selection component. For example, the selection component may be a transistor and the word line 110 may be connected to the gate of the transistor. Energizing the word line 110 results in an electrical connection or closed circuit between the logic storing device of a memory cell 105 and its corresponding digit line 115. The digit line 115 may then be accessed to either read or write the memory cell 105. Upon selecting a memory cell 105, the resulting signal may be used to determine the stored logic state. In some cases, a first logic state may correspond to no current or a negligibly small current, whereas a second logic state may correspond to a finite amount of current. In some cases, a memory cell 105 may include a 3DXP memory cell or a self-selecting memory cell, both having two terminals and may not need a separate selection component. As such, one terminal of the 3DXP memory cell or the self-selecting memory cell may be electrically connected to a word line 110 and the other terminal of the 3DXP memory cell or the self-selecting memory cell may be electrically connected to a digit line 115.

Accessing memory cells 105 may be controlled through a row decoder 120 and a column decoder 130. For example, a row decoder 120 may receive a row address from the memory controller 140 and energize the appropriate word line 110 based on the received row address. Similarly, a column decoder 130 may receive a column address from the memory controller 140 and energize the appropriate digit line 115. For example, the 3D memory array 102 may include multiple word lines 110, labeled WL_B1 (or WL_T1) through WL_BM (or WL_TM), and multiple digit lines 115, labeled DL_1 through DL_N, where M and N depend on the array size. Thus, by energizing a word line 110 and a digit line 115, e.g., WL_B2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected (e.g., a memory cell 105 turns on, switches on, conducts current, or becomes activated). In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-a (in a dashed box). An ordinary person skilled in the art would appreciate that sense component may be associated either with column decoder or row decoder without losing its functional purposes.

A memory cell 105 may be set or written by similarly energizing the relevant word line 110 and digit line 115 and at least one logic value may be stored in the memory cell 105. Column decoder 130 or row decoder 120 may accept data, for example input/output 135, to be written to one or more memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, energizing a single word line 110 may result in the discharge of all memory cells 105 in the row; thus, several or all memory cells 105 in the row may need to be re-written. But in non-volatile memory, such as self-selecting memory, PCM (e.g., 3DXP memory), FeRAM, or 3D NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to energize the desired word line 110 and digit line 115. Memory controller 140 may also generate and control various voltages or currents used during the operation of memory device 100.

The memory controller 140 may receive user data through the input/output 135. In some embodiments, the memory controller 140 encodes the user data to satisfy a condition prior to storing the user data in memory cells 105. The condition may be satisfied when encoded user data have a predetermined number of bits exhibiting a given logic state (e.g., a logic state of 1). As a way of example, the encoded user data may be configured to have 50% of the memory cells storing the encoded user data to exhibit the logic state of 1 while the other 50% of the memory cells to exhibit a logic state of 0. This may be referred to as a balanced encoding process where half of the encoded user data bits have a logic state of 1, and the other half have a logic state of 0. In some examples, count data may be defined as the number of bits of the encoded user data having given logic state (e.g., a logic state of 1 or a logic state of 0), and the value of the count data may be encoded and stored by the memory controller 140 (e.g., in a register). During the encoding process, the memory controller 140 may add a certain number of bits (e.g., parity bits) to the user data to establish the predetermined number of memory cells to exhibit the given logic state. As a result of adding the parity bits, the encoded user data may have more bits than the user data. In some embodiments, a different percentage value (e.g., 40%, 60%, 75%) of the memory cells exhibiting the logic state of 1 may be employed during the encoding process, and as above, the encoded count data representative of the number of bits of the encoded user data having a given logic state (e.g., a logic state of 1 or a logic state of 0) may be stored by the memory controller 140 (e.g., in a register). Further, constant weight codes may be utilized in which all of the codewords (e.g., the encoded user data with optional parity bits) may have the same number of bits of a given logic state regardless of the length of the codeword. In such instances, the total percentage of bits having the given logic state may vary depending on the length of the codeword, however the number of bits of encoded user data having the given logic state is the same across all codewords employing the constant weight code scheme.

The memory controller 140 may apply a read voltage to the memory array 102 to activate a group of memory cells 105 containing the encoded user data with the predetermined number of bits exhibiting the given logic state. The read voltage may have a constant rate of increase or monotonically increasing staircase shape. The applied read voltage may activate a subset of the memory cells 105 containing the encoded user data as a result of applying the read voltage when the applied read voltage across the memory cells 105 exceeds their threshold voltages. The memory controller 140 may track the number of activated memory cells 105 and compare the number to the predetermined number stored in the register. When the number of activated memory cells 105 matches the predetermined number, the memory controller 140 may determine that all the memory cells exhibiting the given logic states are accounted for out of the group of memory cells containing the encoded user data and stop applying to read voltage. Subsequently, the memory controller 140 may determine that all the activated memory cells 105 has the given logic state.

In general, the amplitude, shape, polarity, and/or duration of an applied voltage or current discussed herein may be adjusted or varied and may be different for the various operations discussed in operating the memory device 100. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

FIG. 2 illustrates an example of a memory array 102 that supports auto-referenced memory cell read techniques in accordance with embodiments of the present disclosure. Memory array 202 may be an example of portions of memory array 102 described with reference to FIG. 1. As depicted in FIG. 2, memory array 202 includes multiple materials to construct a memory cell 105-a. Each memory cell 105-a is stacked in a vertical direction (e.g., perpendicular to a substrate) to create memory cell stacks (e.g., the memory cell stack 145). The memory cell 105-a may be an example of a memory cell 105 described with reference to FIG. 1. Memory array 202 may thus be referred to as a 3D memory array. The architecture of memory array 202 may be referred to as a cross-point architecture. Although some elements included in FIG. 2 are labeled with a numeric indicator, other corresponding elements are not labeled, though they are the same or would be understood to be similar, in an effort to increase visibility and clarity of the depicted features.

Memory array 202 also includes word lines 110-a and bit lines 115-a, which may be examples of word line 110 and bit line 115 described with reference to FIG. 1. Illustration of the materials between the word lines 110-a and the bit lines 115-a depicted in FIG. 2 may represent a lower portion of the memory cell 105 in FIG. 1. Memory array 202 includes electrodes 205, logic storage elements 210, selector device elements 220, and a substrate 225. In some examples, a single component including a chalcogenide alloy (not shown, replacing selector device element 220, logic storage element 210, and electrode 205-b) may act as both a logic storage element and a selector device. Electrode 205-a may be in electronic communication with bit line 115-a and electrode 205-c may be in electronic communication with word line 110-a.

Insulating materials depicted as empty spaces may be both electrically and thermally insulating. As described above, in PCM technology, various logic states may be stored by varying the electrical resistance of the logic storage element 210 in memory cells 105-a, which in turn exhibiting varying threshold voltages of the memory cells 105-a. In some cases, storing various logic states includes passing a current through the memory cell 105-a, heating the logic storage element 210 in memory cell 105-a, or melting (e.g., wholly or partially) the material of the logic storage element 210 in memory cell 105-a. Other storage mechanisms, such as threshold voltage modulation, may be exploited in chalcogenide-based memories.

In some cases, memory array 202 may include an array of memory cell stacks, and each memory cell stack may include multiple memory cells 105-a. Memory array 202 may be made by forming a stack of conductive materials, such as word lines 110-a, in which each conductive material is separated from an adjacent conductive material by electrically insulating materials in between. The electrically insulating materials may include oxide or nitride materials, such as silicon oxide, silicon nitride, or other electrically insulating materials. These materials may be formed above the substrate 225, such as a silicon wafer, or any other semiconductor or oxide substrate. Subsequently, various process steps may be utilized to form the materials in between the word lines 110-a and bit lines 115-a such that each memory cell 105-a may be coupled with a word line 110-a and a bit line 115-a.

The selector device element 220 may be connected with the logic storage element 210 through electrode 205-b. In some examples, the positioning of the selector device element 220 and the logic storage element 210 may be flipped. The composite stack including the selector device element 220, the electrode 205-b, and the logic storage element 210 may be connected to a word line 110-a through the electrode 205-c and to a bit line 115-b through the electrode 205-a. The selector device element 220 may aid in selecting a particular memory cell 105-a or may help prevent stray currents from flowing through non-selected memory cells 105-a adjacent to a selected memory cell 105-a. The selector device element 220 may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device element includes a chalcogenide alloy. The selector device, in some examples, include an alloy of selenium (Se), arsenic (As), silicon (Si), and germanium (Ge).

As discussed above, memory cells 105-a of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Many chalcogenide alloys may be possible—for example, a germanium-antimony-tellurium alloy (Ge—Sb—Te) is a chalcogenide material. Other chalcogenide alloys not expressly recited here may also be employed.

To set a low-resistance state, a memory cell 105-a may be heated by passing a current through the memory cell 105-a. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-a may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

In some cases, memory cells 105-a may exhibit different electrical characteristics after a number of cycling operations (e.g., a series of read or write operations). For example, a threshold voltage of a memory cell 105-a (e.g., PCM cell) corresponding to a logic state of 1, after receiving an identical programming pulse to store the logic state of 1 (e.g., a SET programming pulse), may be different if a memory cell 105-a is relatively new (e.g., a PCM cell with a small number of read or write operations) compared to a memory cell 105-a having been cycled through an extensive number of read or write operations. In addition, in some cases, a chalcogenide material in the memory cells 105-a (e.g., the logic storage element 210) may experience a change (which may also be referred to as a drift) in its resistance after programming (e.g., crystallizing or quenching) of the chalcogenide material during a write operation. Such change in resistance may result in changes in threshold voltages of memory cells 105-a and may hinder accurately reading information from memory cells 105-a (e.g., PCM cells) after a certain period of time elapsed. In some embodiments, the amount of change may be a function of an ambient temperature.

The auto-referenced read techniques may provide a robust read technique when memory cells 105-a (e.g., PCM cells) exhibit different electrical characteristics described above. In some embodiments, the memory cells 105-a may be configured to store encoded user data that include modified user data (or original user data, in some cases) and a number of parity bits, which may be added thereto. In some cases, the encoded user data stored in the memory cells 105-a have been modified to include a predetermined number of bits having the logic state of 1. The number of bits having the logic state of 1 may be different depending on encoding scheme employed. In some cases, the number of bits having the logic state of 1 may be 50% (or other percentage) of the bits containing the encoded user data. In some embodiments, the memory cells 105-*a* may be configured to store user data while an additional set of memory cells 105-*a* is configured to store a counting information. The counting information may represent a number of bits in the user data having the logic state of 1. In some cases, the counting information may be read in advance to extract the number of bits in the user data having the logic state of 1 before the user data are read. Additionally or alternatively, the counting information may be determined while the user data are being read. The auto-referenced read techniques utilize encoding schemes that provide a precise number of memory cells 105-*a* having the logic state of 1, which may in turn enable the auto-referenced read techniques to read user data accurately regardless of the different electrical characteristics of memory cells described above.

Figure 3A:
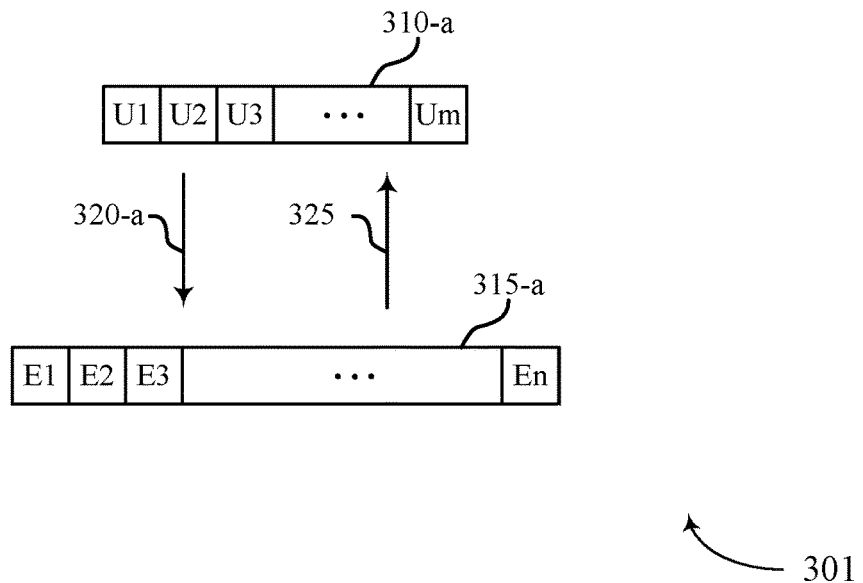
FIGS. 3A and 3B illustrate examples of user data patterns that support auto-referenced memory cell read techniques in accordance with embodiments of the present disclosure.

FIG. 3A illustrate an example of user data pattern diagram 301 that supports auto-referenced memory cell read techniques in accordance with embodiments of the present disclosure. The user data pattern diagram 301 includes user data 310-*a* and encoded user data 315-*a*. Encoding process 320-*a* may convert the user data 310-*a* into the encoded user data 315-*a*. The encoded user data 315-*a* may be stored in a set of memory cells, which may be examples of memory cells 105 described with reference to FIGS. 1 and 2. Each box of the encoded user data 315-*a* may correspond to a memory cell (e.g., memory cell 105 or 105-*a*) that may exhibit a logic state of 1 or a logic state of 0. During the encoding process 320-*a*, a number of parity bits may be added to the user data 310-*a* to establish a predetermined number of bits of the encoded user data 315-*a* having a given logic state (e.g., a logic state of 1). As a result, a number of bits in the encoded user data 315-*a* may be greater than the number of bits in the user data 310-*a* (e.g., n is larger than m if parity bits are added). Decoding process 325 may convert the encoded user data 315-*a* back to the user data 310-*a* after the encoded user data 315-*a* has been accurately read.

In some embodiments, for each user data, corresponding encoded user data may have a same number of memory cells exhibiting a logic state of 1 and a logic state of 0 (which may also be referred to as a balanced encoding scheme). As such, the encoded user data may be referred to have a 50% weight. In some embodiments, for each user data, corresponding encoded user data may have a predetermined number of memory cells exhibiting a given logic state (e.g., a logic state of 1), hence producing a constant weight that may be different than 50% (which may also be referred to as a constant weight encoding scheme). As described above, an outcome of the encoding process 320-*a* may be that a predetermined number of memory cells exhibiting a given logic state (e.g., a logic state of 1) in the encoded user data 315-*a* is established. The auto-referenced read techniques may utilize the fact that such a predetermined number of memory cells exist for the encoding process 320-*a* (e.g., a balanced encoding scheme, a constant weight encoding scheme) to accurately read the encoded user data 315-*a* as described below with reference to FIG. 4A.

Figure 3B:
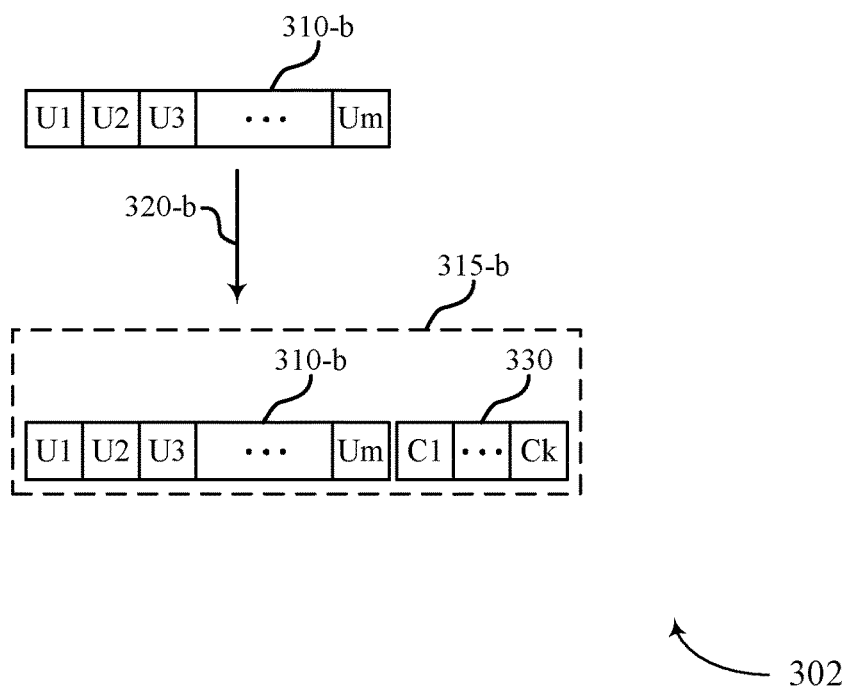

FIG. 3B illustrate an example of user data pattern diagram 302 that supports auto-referenced memory cell read techniques in accordance with embodiments of the present disclosure. The user data pattern diagram 302 includes user data 310-*b* and encoded user data 315-*b*. Encoding process 320-*b* may encode the user data 310-*b* into the encoded user data 315-*b*. The encoded user data may include the user data 310-*b* in addition to count data 330. A number of memory cells of the count data 330 may be determined by a length of the user data 310-*b*. In some cases, the count data 330 includes k memory cells when the user data is $2^k$ bits long. In other cases, the count data 330 may include 2×k memory cells when the user data is $2^k$ bits long. The count data 330 may be stored in a first set of memory cells (e.g., memory cell 105) that share a common access line (e.g., word line 110) with a second set of memory cells (e.g., memory cell 105) that stores the user data 310-*b*. In some cases, the count data 330 are stored in a first set of memory cells (e.g., memory cell 105) that does not share a common access line (e.g., word line 110) with a second set of memory cells (e.g., memory cell 105) that stores the user data 310-*b*.

In some embodiments, during the encoding process 320-*b*, a total number bits having a given logic state (e.g., a logic state of 1) of the user data 310-*b* may be identified and the total number may be stored in the count data 330 (e.g., as a binary number). As an example, when the user data 310-*b* is 16 bits long (e.g., $2^4$ bits long) and has 9 bits out of 16 bits having a logic state of 1, the count data 330 is 4 bits long and corresponds to a binary number 1001. In other embodiments, during the encoding process 320-*b*, the total number bits exhibiting a given logic state (e.g., a logic state of 1) of the user data 310-*b* may be identified and the total number may be encoded in the count data 330 by converting each digit of the binary number (e.g., 1001) to a pair of digits (e.g., a binary digit of 1 to 10 and a binary digit of 0 to 01). Using the same example described above, when the user data 310-*b* is 16 bits long (e.g., $2^4$ bits long) and has 9 bits (e.g., a binary number of 1001) exhibiting a logic state of 1, the count data 330 may be 8 bits long and correspond to 10010110. Such an encoding provides the count data 330 to have a balanced weight of 50%. As described above, an outcome of the encoding process 320-*b* may be that a known number of memory cells having a given logic state (e.g., a logic state of 1) in the user data 310-*b* is established and stored in the count data 330. The auto-referenced read techniques may utilize such a number available for each user data 310-*b* to accurately read the user data 310-*b* as described below with reference to FIG. 4B.

Figure 4A:
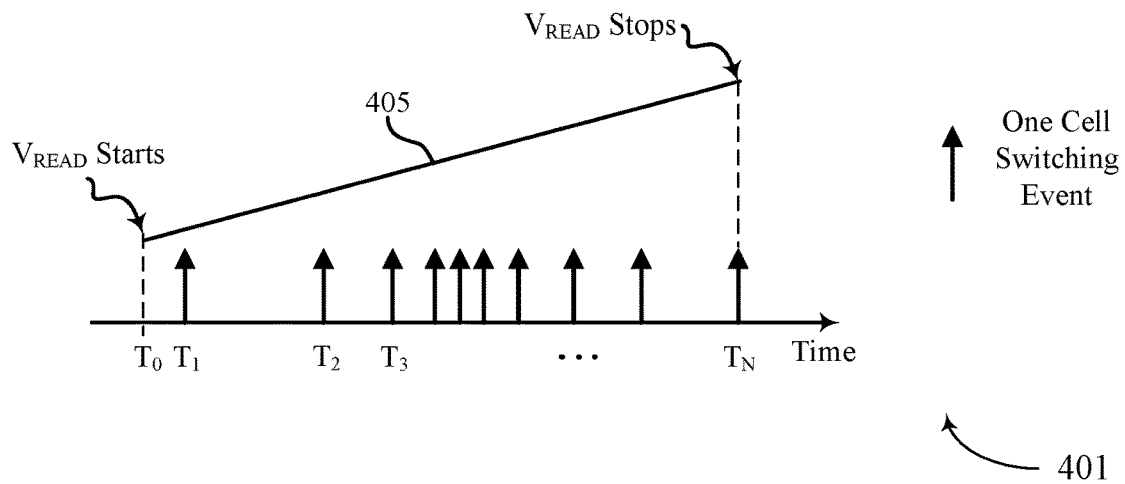
FIGS. 4A and 4B illustrate techniques that support auto-referenced memory cell read techniques in accordance with embodiments of the present disclosure.

FIG. 4A illustrates an exemplary diagram 401 that support auto-referenced memory cell read techniques in accordance with various embodiments of the present disclosure. The diagram 401 illustrates a read voltage 405 (e.g., $V_{READ}$) applied to memory cells (e.g., memory cells 105 described with reference to FIGS. 1 and 2) that stores encoded user data (e.g., encoded user data 315-*a* described with reference to FIG. 3A). The encoded user data may be configured to have a predetermined number of memory cells to exhibit a given logic state (e.g., a logic state of 1). The read voltage may be applied to the memory cells through a bit line (e.g., bit lines 115 described with reference to FIGS. 1 and 2) and a word line (e.g., word lines 110 described with reference to FIGS. 1 and 2). In some embodiments, the read voltage 405 has a constant ramp rate as depicted in FIG. 4A. In some embodiments, the read voltage 405 has a monotonically increasing staircase shape. The diagram 401 illustrates that a subset of the memory cells activates in response to the read voltage 405. Each upward arrow in FIG. 4A represents one memory cell switching event (e.g., a memory cell 105 activates, turns on, switches on).

The diagram 401 also illustrates that the encoded user data (e.g., encoded user data 315-*a*) is configured with a predetermined number, N bits exhibiting a logic state of 1, for example. The auto-referenced read techniques may initialize a counter (which may also be referred to as a dynamic counter) in a memory device. The auto-referenced read techniques may also store the predetermined number N in the memory device. At time $T_0$, the read voltage 405 may be applied to the memory cells storing the encoded user data. An initial value of the read voltage 405 may be less than a lowest threshold voltage of the memory cells such that none of the memory cells activates at time $T_0$. In some cases, the initial value of the read voltage 405 may be greater than the lowest threshold voltage of the memory cells (not shown) such that a number of memory cells activates at time $T_0$. At time $T_1$, a first memory cell may activate when the read voltage 405 applied to the first memory cell exceeds a threshold voltage associated with the first memory cell. The auto-referenced read techniques may update the counter to one to record that the first memory cell has activated. Subsequently the auto-referenced read techniques may compare the number stored at the counter to the predetermined number N. When the number in the counter is less than the predetermined number N, application of the read voltage 405 to the memory cells continues. The auto-referenced read techniques may track additional number of memory cells activated (e.g., memory cells activated at $T_2$, $T_3$, and so on) as the read voltage 405 continues to increase and update the counter.

At time $T_N$, an Nth memory cell may activate as the read voltage 405 applied to the Nth memory cell exceeds a threshold voltage associated with the Nth memory cell. The auto-referenced read techniques update the counter to N based on the activation of the Nth memory cell and compare the number stored in the counter with the predetermined number N. The auto-referenced read techniques may determine that the number stored in the counter matches with the predetermined number N and stop applying the read voltage 405. Subsequently, the auto-referenced read techniques may determine the activated memory cells (e.g., memory cells corresponding to switching events at time $T_1$ through $T_N$) correspond to the logic state of 1. Additionally, the auto-referenced read techniques may determine the remaining memory cells (e.g., memory cells remaining unactivated until the Nth switching event) correspond to the logic state of 0 (e.g., the memory cells associated with threshold voltages higher than the threshold voltages of the activated memory cells). After reading the encoded user data (e.g., encoded user data 315-a) using the auto-referenced read techniques, the user data (e.g., user data 310-a) may be decoded using a decoding process (e.g., decoding process 325). In other embodiments, after stopping applying the read voltage 405, the user data (e.g., encoded user data 310-b described with reference to FIG. 3B) are output.

In some embodiments, the auto-referenced read techniques may utilize a mean value estimating scheme based on properties of order statistics in which a single probability density function representing a particular weight of encoded user data may be used. By way of example, a single probability density function representing a weight of 50% (e.g., 64 bits of a 128 bits encoded user data having a logic state of 1 under the balanced coding scheme) may be used to determine that a jth switching event as an estimated median value of the threshold voltage distribution of the 64 bits having the logic state of 1. The determination of the jth switching event may be associated with an uncertainty $U_j$, which may be heuristically expressed as $U_j=2\times3.54\sigma_{64}$ where $\sigma_{64}$ represents a standard deviation of the probability distribution function associated with the given j value for the known case of 64 bits having the logic state of 1 (e.g., 50% weight under the balanced coding scheme) and a half-width of the threshold voltage distribution is estimated in terms of a standard deviation associated with a predetermined acceptable error rate. Further, the auto-referenced read techniques may determine a duration to maintain the read voltage 405 after the jth switching event to accurately detect additional memory cells exhibiting the logic state of 1. In some cases, applying the read voltage 405 may continue for a duration of time after it is determined that the appropriate reading voltage has been reached (e.g., to provide some margin).

Figure 4B:
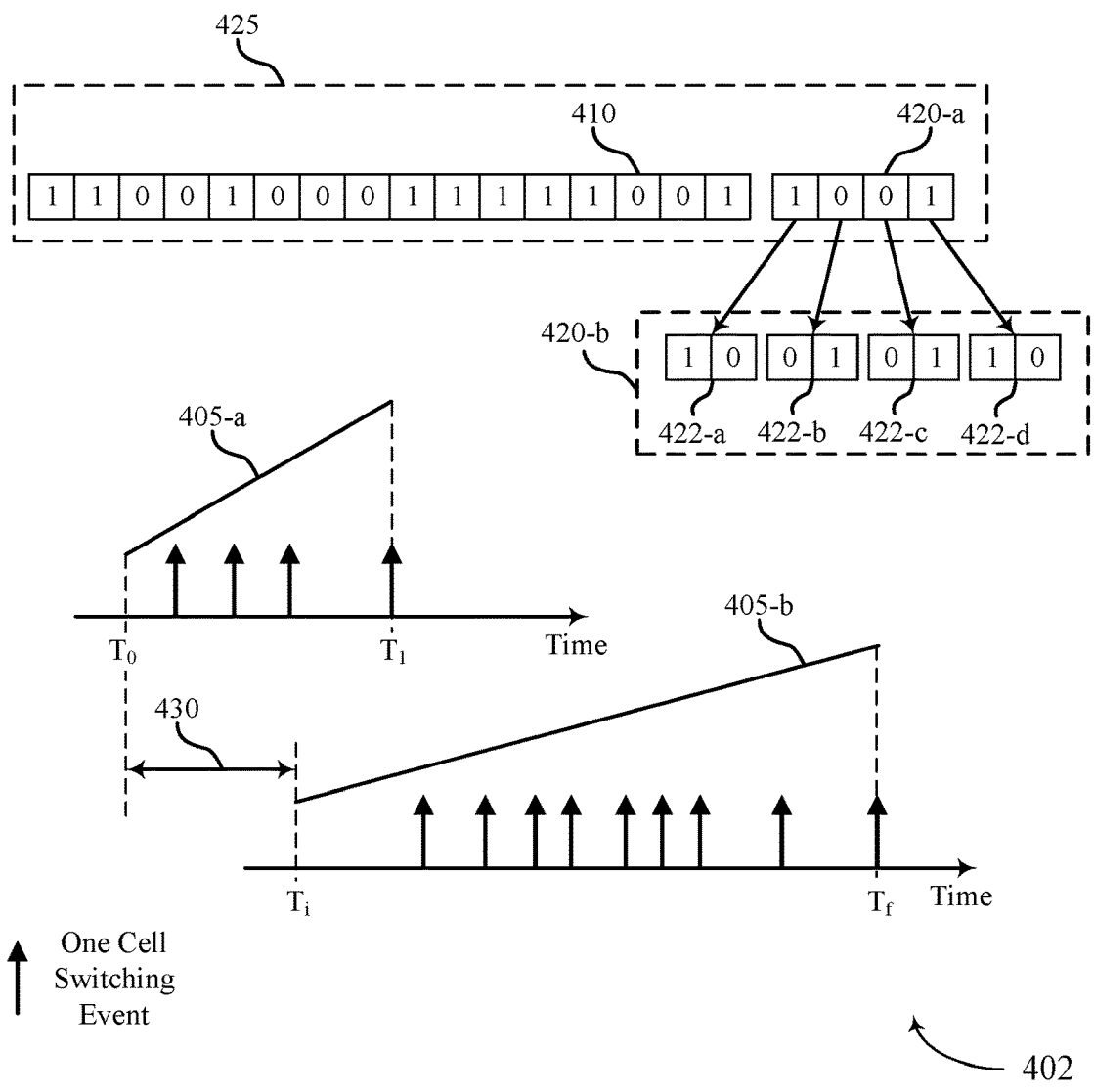

FIG. 4B illustrates an exemplary diagram 402 that supports auto-referenced memory cell read techniques in accordance with various embodiments of the present disclosure. The diagram 402 illustrates user data 410, first count data 420-a, and second count data 420-b. The user data 410 may be an example of the user data 310 described with reference to FIG. 3B. The first counting data 420-a and the second count data 420-b may be examples of the count data 330 described with reference to FIG. 3B. The count data (e.g., 420-a or 420-b) may be stored in a first set of memory cells (e.g., memory cell 105) that share a common access line (e.g., word line 110) with a second set of memory cells (e.g., memory cell 105) that stores the user data 410. In some cases, the count data (e.g., 420-a or 420-b) are stored in a first set of memory cells (e.g., memory cell 105) that does not share a common access line (e.g., word line 110) with a second set of memory cells (e.g., memory cell 105) that stores the user data 410. Additionally, the diagram 402 illustrates a first read voltage 405-a applied to the memory cells storing the count data 420-b and a second read voltage 405-b applied to the memory cells storing the user data 410. The first read voltage 405-a and the second read voltage 405-b may be examples of the read voltage 405 described with reference to FIG. 4A. The diagram 402 illustrates that a subset of the memory cells activates in response to the read voltage 405. Each upward arrow in FIG. 4B represents one memory cell switching event (e.g., a memory cell 105 activates, turns on, switches on).

During an encoding stage, the auto-referenced read techniques may employ an encoding process (e.g., encoding process 320-b described with reference to FIG. 3B) to identify a total number of bits having a given logic state (e.g., a logic state of 1) and store the total number in memory cells corresponding to the count data 420. Combination of the user data 410 and the count data 420 may represent encoded user data 425. The user data 425 may be an example of the encoded user data 315-b described with reference to FIG. 3B.

In some embodiments, the total number of bits of the user data 410 having the logic state of 1 may be stored in the count data 420-a as a binary number. As a way of example, when the user data 410 is 16 bits long (e.g., $2^4$ bits long) and has 9 bits out of 16 bits having a logic state of 1, the count data 420-a is 4 bits long and corresponds to a binary number 1001. During a read operation, the auto-referenced read techniques may read the total number from the count data 420-a (e.g., 1001 or 9) before applying the read voltage 405-a to the memory cells storing the user data 410. The auto-referenced read techniques may store the total number in a set of DRAM cells or a register in a memory device and initialize a counter (which may be referred to as a dynamic counter) in the memory device. The auto-referenced read techniques may then utilize similar steps described with reference to FIG. 4A.

At time $T_j$, the auto-referenced read may apply the read voltage 405-b to the memory cells storing the user data 410. The auto-referenced read techniques may update the counter (e.g., the dynamic counter) as a subset of the memory cells storing the user data 410 activates. The auto-referenced read techniques compare the number in the counter (e.g., the dynamic counter) to the number stored in the DRAM cells or the register (e.g., 9) and determine whether to continue application of the read voltage 405-b. At time $T_f$, when 9th memory cell activates, the auto-referenced read techniques may update the number in the counter to 9 and determine that the number in the counter matches the total number stored in the DRAM cells or the register and stop applying the read voltage 405-b. Subsequently, the auto-referenced read techniques may determine the activated memory cells (e.g., memory cells activated by the time $T_f$) correspond to the logic state of 1 and that the remaining memory cells (e.g., memory cells remaining inactive by the time $T_f$) correspond to the logic state of 0 (e.g., the memory cells associated with threshold voltages higher than the threshold voltages of the activated memory cells).

In some embodiments, the total number bits exhibiting a given logic state (e.g., a logic state of 1) of the user data 410 may be identified and the total number may be encoded in the count data 420-b by converting each digit of the binary number (e.g., 1001) to a pair of digits (e.g., a binary digit of 1 to 10 and a binary digit of 0 to 01). Each pair of digits 422 may represent the single binary digit of 1 or 0. By way of example, the pair of digits 422-a or 422-d may represent a binary digit of 1. The pair of digits 422-b or 422-c may represent a binary digit of 0. Using the same example described above, when the user data 410 is 16 bits long (e.g., $2^4$ bits long) and has 9 bits (e.g., a binary number of 1001) exhibiting a logic state of 1, the count data 420-b may be 8 bits long and correspond to 10010110. Such an encoding provides the count data 420-b to have a balanced weight of 50%. In other words, when a length of user data 410 is determined, a length of count data 420-b is determined and one-half of the length of the count data 420-b corresponds to the number of bits of the count data 420-b having the logic state of 1.

In some embodiments, a number (e.g., a threshold) representing one-half of the length of the count data 420-b may be stored in a memory device. The number (e.g., 4 in the example depicted in FIG. 4B) may correspond to the number of bits of the count data 420-b exhibiting a logic 1. The auto-referenced read techniques may initiate a first counter to track a number of memory cells activated out of the memory cells that stores the user data 410 and a second counter to track a number of memory cells activated out of the memory cells that stores the count data 420-b. The auto-referenced read may apply the read voltage 405-a to the memory cells storing the count data at time $T_0$. The auto-referenced read techniques may update a number in the second counter to track a number of memory cells activated in response to the read voltage 405-a. The auto-referenced read techniques may compare the number in the second counter to the number (e.g., the threshold) stored in the memory device and determine whether the number in the second counter matches to the number (e.g., the threshold). The auto-referenced read techniques may continue applying the read voltage 405-a to the memory cells storing the count data 420-b when the number in the second counter is less than the number (e.g., the threshold). At time $T_1$, the last memory cell exhibiting the logic state of 1 may activate out of the memory cells storing the count data 420-b. The last memory cell is a 4th memory cell in the example depicted in FIG. 4B. The auto-referenced read techniques may update the second counter and determine the number in the second counter (e.g., 4) matches with the number (e.g., the threshold). Subsequently, the auto-referenced read techniques may stop applying the read voltage 405-a to the memory cells storing the count data 420-b and read the information stored in the count data 420-b (e.g., reading 9 out of 10010110). In some embodiments, the auto-referenced read techniques may set a flag in a memory device as valid to indicate that the total number of bits exhibiting a logic state of 1 in the user data 410 has been identified.

In some embodiments, the auto-referenced read may apply the read voltage 405-b to the memory cells storing the user data 410 at time $T_i$. The auto-referenced read techniques may update a number in the first counter to track a number of memory cells activated in response to the read voltage 405-a. The auto-referenced read techniques may compare the number in the first counter to the number identified and indicated as valid by the flag to determine whether the number in the first counter matches to the number identified and indicated as valid by the flag. The auto-referenced read techniques may continue applying the read voltage 405-b to the memory cells storing the user data 410 when the number in the first counter is less than the number identified and indicated as valid by the flag. At time $T_f$, the last memory cell (e.g., the 9th memory cell of FIG. 4B) exhibiting the logic state of 1 may activate out of the memory cells storing the user data 410. The auto-referenced read techniques may update the first counter and determine the number in the first counter (e.g., 9) matches with the number identified and indicated as valid. Subsequently, the auto-referenced read techniques may stop applying the read voltage 405-b to the memory cells storing the user data 410 and determine that the activated memory cells (e.g., memory cells corresponding to switching events during $T_i$ through $T_f$) correspond to the logic state of 1 and that the remaining memory cells (e.g., memory cells remaining inactive by the time $T_f$) correspond to the logic state of 0 (e.g., the memory cells associated with threshold voltages higher than the threshold voltages of the activated memory cells).

In some embodiments, the read voltage 405-b applied to the memory cells storing the user data 410 may have an offset 430 in comparison to the read voltage 405-a applied to the memory cells storing the count data 420-b. In some embodiments, the read voltage 405-a and the read voltage 405-b may have a different slope (e.g., a ramp rate). In some instances, the read voltage 405-a may have a greater slope than the read voltage 405-b. In some cases, a single read voltage may function as both the read voltage 405-a and the read voltage 405-b. In some aspects, the count data 420-b may be stored in a first set of memory cells (e.g., memory cell 105) that share a common access line (e.g., word line 110) with a second set of memory cells (e.g., memory cell 105) that stores the user data 410 and a single read voltage may be applied to both the first set of memory cells and the second set of memory cells. In some embodiments, each pair of digits 422 may be configured to couple with a toggle indicator. In the example depicted in FIG. 4B, a total of four toggle indicators (not shown) may be coupled to the count data 420-b, one toggle indicator for each pair of digits 422 (e.g., 422-a, 422-b, 422-c, and 422-d). Each toggle indicator may be configured to trigger when one of two memory cells corresponding to the pair activates in response to a read voltage (e.g., the read voltage 405-a). Outputs of each toggle indicator may be further configured to set a flag in a memory device when all the toggle indicators has been triggered (e.g., all the pairs of digits 422 have one of two memory cells activated). The auto-referenced read techniques may read the information stored in the count data 420-b (e.g., reading 9 out of 10010110) based on the flag being set as valid. The flag also indicates that the total number of bits exhibiting a logic state of 1 in the user data 410 has been identified. As described above, the auto-referenced read techniques may utilize the total number of bits exhibiting a logic state of 1 in the user data 410 to accurately determine application of the read voltage 405-*b* to the memory cells storing the user data 410 and identify all the memory cells corresponding to the logic state of 1.

As described in FIGS. 4A and 4B, when both the count data 420 and the user data 410 are simultaneously addressed by a same read voltage, using a pair of digits 422-*a*, 422-*b*, 422-*c*, 422-*d* to represent each bit of count data 420-*a* (e.g., as depicted in count data 420-*b*) may allow for the determination of the number of bits of the user data 410 having a logic state of 1 before any cell having a logic state of 0 thresholds in the count data 420-*a* and/or 420-*b* and in the user data 410. In some examples, at least one of the memory cells in each pair of bits 422 may threshold before or at time $T_N$ (or time $T_1$).

Figure 5:
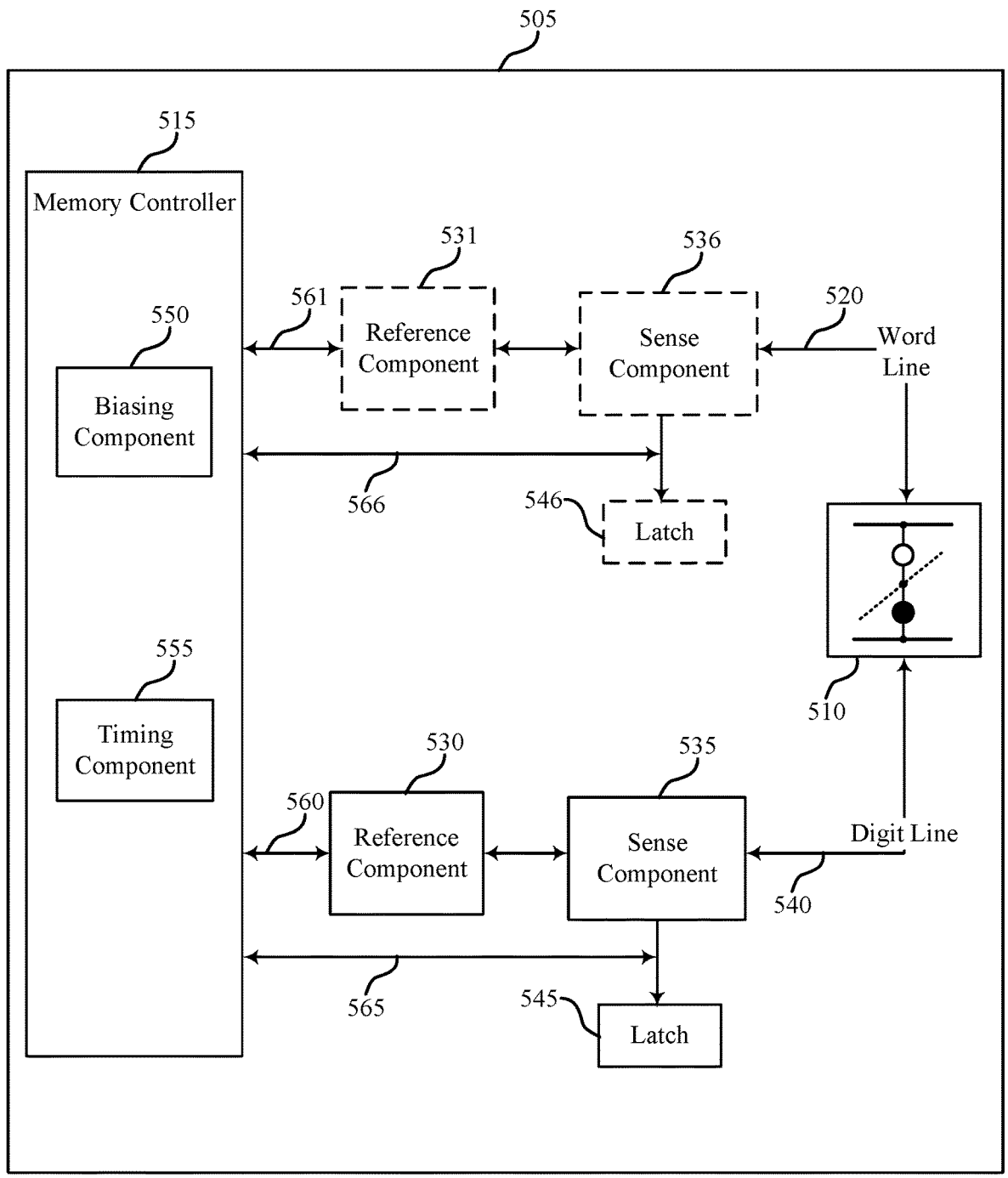
FIGS. 5 and 6 show block diagrams of a device that supports auto-referenced memory cell read techniques in accordance with embodiments of the present disclosure.

FIG. 5 shows a block diagram 500 of a memory array 505 that supports auto-referenced memory cell read techniques in accordance with embodiments of the present disclosure. The memory array 505 may be referred to as an electronic memory apparatus, and may be an example of a component of a memory device 100 as described herein.

Figure 7:
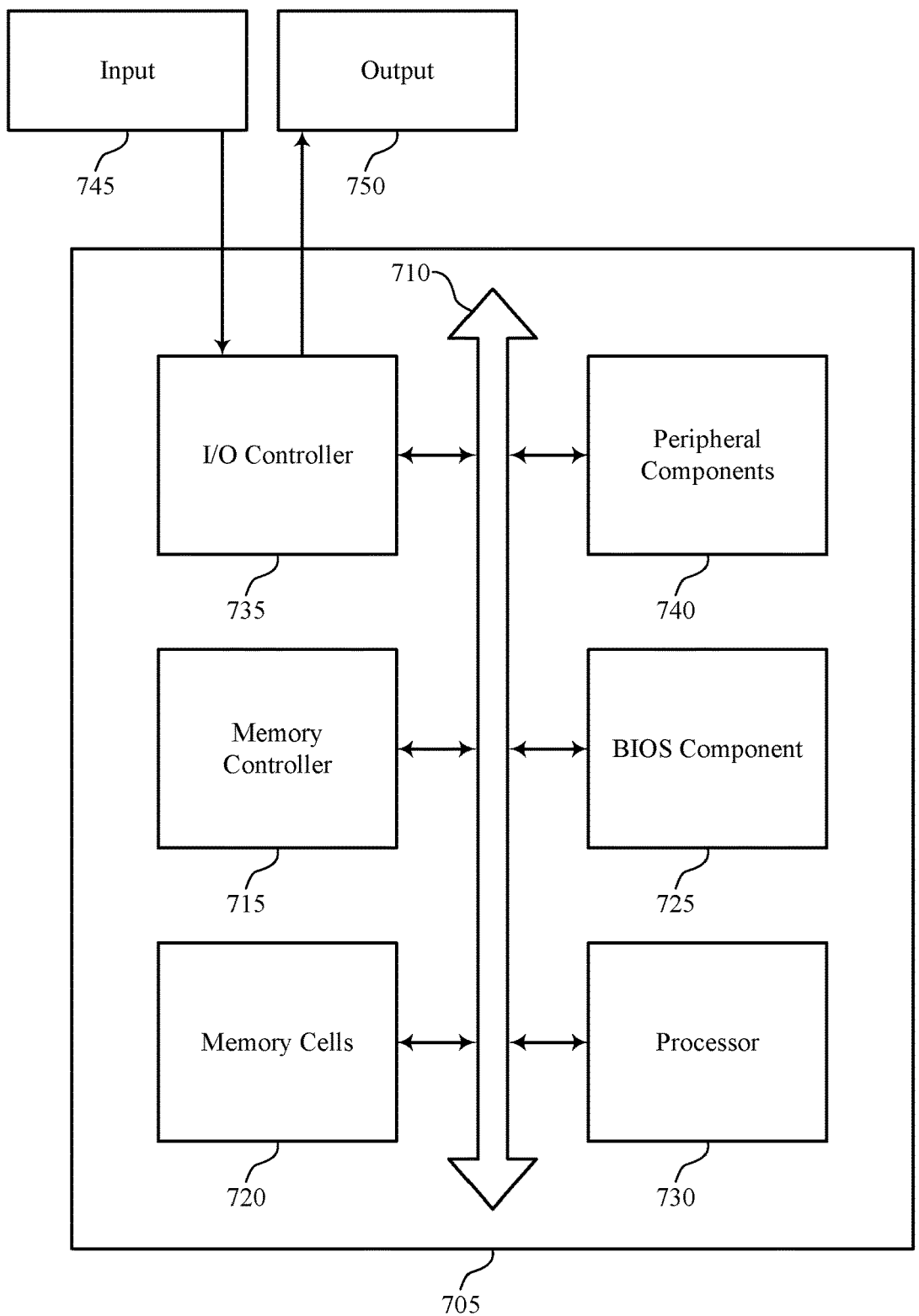
FIG. 7 illustrates a block diagram of a system including a memory array that supports auto-referenced memory cell read techniques in accordance with embodiments of the present disclosure.

The memory array 505 may include one or more memory cells 510, a memory controller 515, a word line 520, a reference component 530, a sense component 535, a digit line 540, and a latch 545. These components may be in electronic communication with each other and may perform one or more of the functions described herein. In some cases, the memory cells 510 may include 3DXP memory cells. In some aspects, the memory controller 515 may include a biasing component 550 and a timing component 555. In some embodiments, a sense component 535 may serve as the reference component 530. In other cases, the reference component 530 may be optional. Also, FIG. 7 shows an alternative schematic option of arranging a sense component 536, a latch 545, and a reference component 531 (in dashed boxes). An ordinary person skilled in the art would appreciate that the sense component and the associated components (i.e., the latch 545 and the reference component 530) may be associated either with a column decoder or a row decoder without losing their functional purposes.

The memory controller 515 may be in electronic communication with the word line 520, the digit line 540, and the sense component 535, which may be examples of the word line 110, the digit line 115, and the sense component 125 described with reference to FIGS. 1 and 2. The components of the memory array 505 may be in electronic communication with each other and may perform aspects of the functions described with reference to FIGS. 1 through 4. In some cases, the reference component 530, the sense component 535, and the latch 545 may be components of the memory controller 515.

In some embodiments, the digit line 540 is in electronic communication with the sense component 535 and a memory cell 510. The memory cell 510 may be writable with a logic state (e.g., a first, second, or third logic state). The word line 520 may be in electronic communication with the memory controller 515 and the memory cell 510. The sense component 535 may be in electronic communication with the memory controller 515, the digit line 540, the latch 545, and the reference line 560. The reference component 530 may be in electronic communication with the memory controller 515 and the reference line 560. A sense control line 565 may be in electronic communication with the sense component 535 and the memory controller 515. These components may also be in electronic communication with other components, both inside and outside of the memory array 505, in addition to components not listed above, via other components, connections, or buses.

The memory controller 515 may be configured to energize the word line 520 or the digit line 540 by applying voltages to those various nodes. For example, the biasing component 550 may be configured to apply a voltage to operate the memory cell 510 to read or write the memory cell 510 as described above. In some cases, the memory controller 515 may include a row decoder, a column decoder, or both, as described herein. This may enable the memory controller 515 to access one or more memory cells 105 as illustrated with reference to FIG. 1. The biasing component 550 may also provide voltage to the reference component 530 in order to generate a reference signal for the sense component 535. Additionally, the biasing component 550 may provide voltages for the operation of the sense component 535.

In some embodiments, the memory controller 515 may perform its operations using the timing component 555. For example, the timing component 555 may control the timing of the various word line selections or bit line biasing, including timing for switching and voltage application to perform the memory functions, such as reading and writing, discussed herein. In some cases, the timing component 555 may control the operations of the biasing component 550.

The reference component 530 may include various components to generate a reference signal for the sense component 535. The reference component 530 may include circuitry configured to produce a reference signal. In some cases, the reference component 530 may be implemented using other 3DXP memory cells. The sense component 535 may compare a signal from the memory cell 510 (through the digit line 540) with a reference signal from the reference component 530. Upon determining the logic state, the sense component may then store the output in the latch 545, where it may be used in accordance with the operations of an electronic device that the memory array 505 is a part. The sense component 535 may include a sense amplifier in electronic communication with the latch 545 and the memory cell 510.

The memory controller 515 and/or at least some of its various sub-components may be implemented in hardware, software executed by a processor, firmware, or any combination thereof. If implemented in software executed by a processor, the functions of the memory controller 515 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 515 and/or at least some of its various sub-components may be physically located at various positions, including being distributed such that portions of functions are implemented at different physical locations by one or more physical devices. In some embodiments, the memory controller 515 and/or at least some of its various sub-components may be a separate and distinct component in accordance with various embodiments of the present disclosure. In other examples, the memory controller 515 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

The memory controller 515 may apply a voltage (e.g., a read voltage) to a memory array configured to activate a group of memory cells containing encoded user data during a read operation. The voltage may increase as a function of time with a constant rate of change. The memory controller 515 may track a number of memory cells turning on (e.g., activating) in response to the read voltage. In some embodiments, the memory controller 515 may compare the number of activated memory cells with a predetermined number stored in a memory device when the encoded user data have been encoded with the predetermined number of memory cells to have the first logic state. When the number of activated memory cells matches the predetermined number, the memory controller 515 may stop applying the read voltage to the memory array and determine that all the activated memory cells of the encoded user data has the first logic state (e.g., SET or RESET cells). Additionally, the memory controller 515 may determine that remaining memory cells of the encoded user data (e.g., the inactive memory cells when the number of activated memory cells matches the predetermined number) have the second logic state (e.g., SET or RESET cells).

Figure 6:
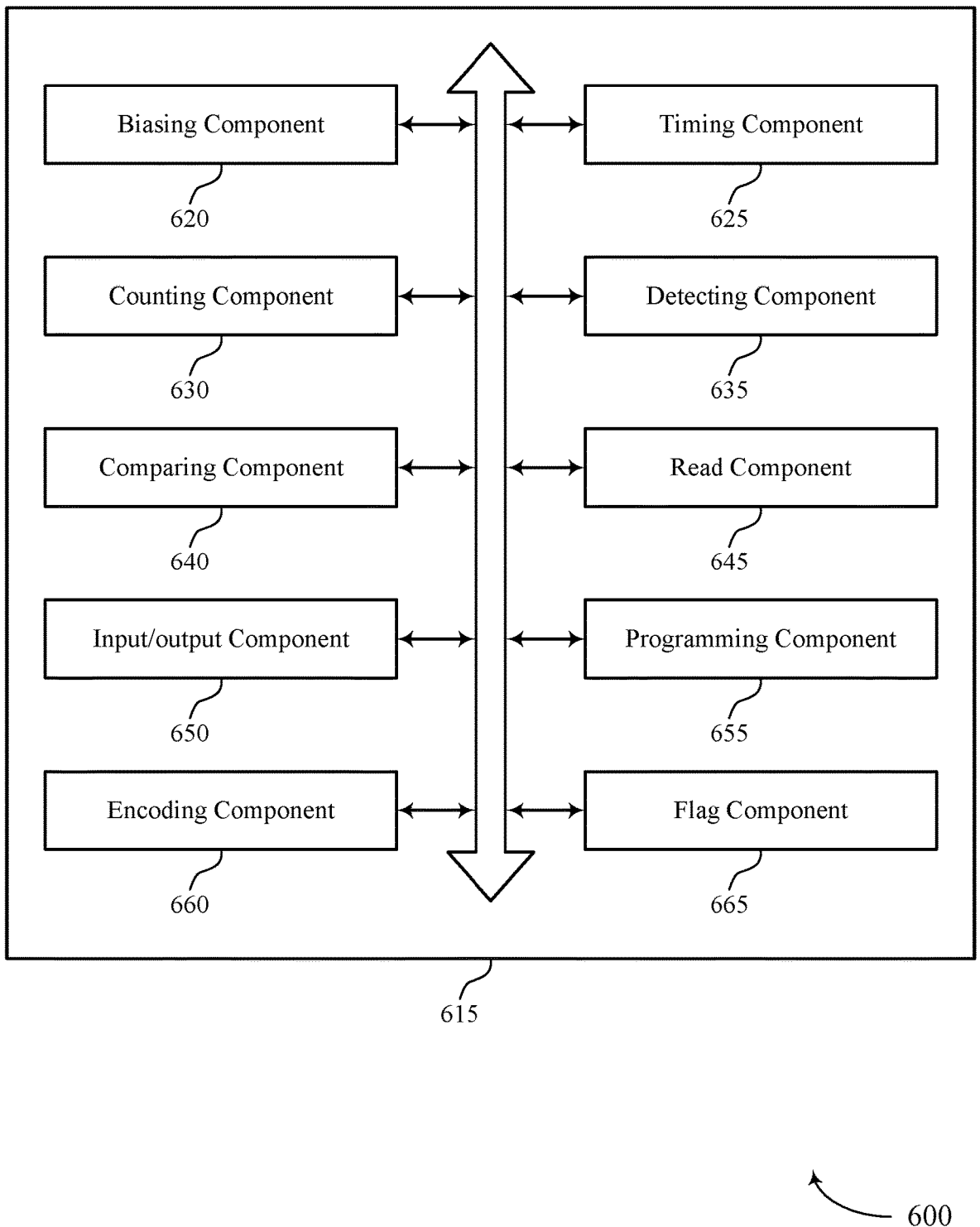

FIG. 6 shows a block diagram 600 of a memory controller 615 that supports auto-referenced memory cell read techniques in accordance with embodiments of the present disclosure. The memory controller 615 may be an example of the memory controller 515 described with reference to FIG. 5. The memory controller 615 may include biasing component 620, timing component 625, counting component 630, detecting component 635, comparing component 640, read component 645, input/output component 650, programming component 655, encoding component 660, and flag component 665. Each of these modules may communicate, directly or indirectly, with one another (e.g., via one or more buses).

The biasing component 620 may activate at least a portion of a first group of memory cells of the memory array by applying a read voltage to the memory array and activate a first subset of the first portion of memory cells by applying a first read voltage to the memory array and a second subset of the second portion of memory cells by applying a second read voltage to the memory array. The biasing component 620 may activate a first subset of the first portion of memory cells by applying a first read voltage to the memory array, and activate at least one cell of each pair of the set of pairs by applying a second read voltage to the memory array.

In some embodiments, the biasing component 620 may stop application of the second read voltage based on the determination that the second value satisfies the threshold, stop application of the read voltage to the memory array based on the determination that the first value satisfies the threshold, where the one or more memory cells are read after application of the read voltage has stopped. The biasing component 620 may maintain application of the first read voltage based on the determination that the first value does not correspond to the identified total number, maintain application of the second read voltage based on the determination that the second value does not satisfy the threshold, and maintain application of the read voltage to the memory array based on the determination that the first value does not satisfy the threshold.

In some embodiments, the biasing component 620 may stop application of the first read voltage based on the determination that the first value corresponds to the identified total number, where the one or more memory cells of the first portion of memory cells are read after application of the first read voltage has stopped. In some cases, the first group of memory cells are configured with a predetermined number of memory cells having a first logic state. In some examples, the first group of memory cells are configured with a fixed number of memory cells independent of a total number of memory cells in the first group. In some aspects, a first half of the first group of memory cells corresponds to a first logic state and a second half of the first group of memory cells corresponds to a second logic state.

In some embodiments, the read voltage includes a set of constant voltages each having a different value over a duration. In some aspects, the first read voltage and the second read voltage are a same single read voltage. In some instances, the first read voltage is configured to have a time offset with respect to the second read voltage. In some examples, the first read voltage is configured to have a different rate of voltage change with respect to the second read voltage.

The counting component 630 may initialize a counter in a controller coupled with a memory array, update the counter to a first value based on determining that the set of memory cells has been activated, and update the counter to a second value based on determining that the second set of memory cells has been activated, where the one or more memory cells are read based on updating the counter to the second value. In some embodiments, the counting component 630 may initialize a first counter and a second counter in a controller coupled with a memory array that includes a first portion of memory cells and a second portion of memory cells, and update the first counter to a first value based on activating the first subset of memory cells and the second counter to a second value based on activating the second subset of memory cells. In some cases, the counting component 630 may initialize a counter in a controller coupled with a memory array that includes a first portion of memory cells and a second portion of memory cells, where the second portion of memory cells includes a set of pairs of memory cells, each pair of the set of pairs associated with a respective flag value, and update the counter to a first count value based on activation of the first subset of memory cells.

Detecting component 635 may determine that a set of memory cells has been activated based on applying the read voltage and determine that a second set of memory cells has been activated based on maintaining application of the read voltage. In some instances, each memory cell of the set of memory cells corresponds to a first logic state. In some cases, the set of memory cells is half of the first group of memory cells.

Comparing component 640 may compare the first value of the updated counter to a threshold stored at the controller, compare the first count value to the determined total number, where one or more memory cells of the first portion of memory cells are read based on the comparison, and compare the second value of the updated second counter to a threshold stored at the controller, where reading one or more memory cells of the first portion of memory cells is based on comparing the second value of the updated second counter to the threshold. In some embodiments, the comparing component 640 may identify, from the second portion of memory cells, a total number of memory cells of the first portion having a first logic state based on the determination that the second value satisfies the threshold, determine that the first value corresponds to the identified total number, and determine that the first value does not correspond to the identified total number.

In some cases, the comparing further includes: determining that the first value does not satisfy the threshold stored at the controller. In some aspects, the threshold is equal to the predetermined number of memory cells having the first logic state. In some instances, the threshold is read from a second group of memory cells of the memory array. In some cases, the comparing further includes: determining that the first value satisfies the threshold stored at the controller. In some embodiments, the comparing further includes: determining that the second value does not satisfy the threshold stored at the controller. In some examples, the comparing further includes: determining that the second value satisfies the threshold stored at the controller.

Read component 645 may read one or more memory cells of the memory array based on the comparison, determine that the set of memory cells that has been activated corresponds to a first logic state, read one or more memory cells of the first portion of memory cells based on updating the first counter and the second counter, and read one or more memory cells of the first portion of memory cells based on the indicator. In some embodiments, the read component 645 may determine, based on a set of values of the second portion of memory cells after activation of the at least one cell, a total number of memory cells of the first portion having a first logic state. In some cases, the first logic state corresponds to a first set of threshold voltages which may be less than a second set of threshold voltages associated with a second logic state.

Input/output component 650 may receive, at a controller, a first set of bits of an input vector from a host device.

Programming component 655 may allocate a block of memory to store the first set of bits of the input vector and a second set of bits based on a total number bits of the first set of bits and write the first set of bits and the second set of bits at the block of memory. In some cases, the second set of bits includes multiple couples of bits representative of the number of bits of the first set of bits having the first logic state.

Encoding component 660 may generate the second set of bits based on a number of bits of the first set of bits having a first logic state and generate a set of bit values corresponding to the determined number of bits. In some cases, generating the second set of bits includes: determining the number of bits of the first set of bits having the first logic state.

Flag component 665 may set a flag in the controller based on identifying the total number of memory cells of the first portion having the first logic state and set an indicator in the controller based on activation of the at least one cell. In some cases, setting the indicator includes: toggling the respective flag value of each pair of the set of pairs from a first flag value to a second flag value based on activation of the at least one cell.

FIG. 7 shows a diagram of a system 700 including a device 705 that supports auto-referenced memory cell read techniques in accordance with embodiments of the present disclosure. The device 705 may be an example of or include the components of memory device 100 as described above, e.g., with reference to FIG. 1. The device 705 may include components for bi-directional voice and data communications including components for transmitting and receiving communications, including a memory controller 715, memory cells 720, a basic input/output system (BIOS) component 725, a processor 730, an I/O controller 735, and peripheral components 740. These components may be in electronic communication via one or more buses (e.g., bus 710).

The memory controller 715 may operate one or more memory cells as described herein. Specifically, the memory controller 715 may be configured to support auto-referenced memory cell read techniques. In some cases, the memory controller 715 is coupled with the cross-point array and operable to perform access operations (e.g., programming or read) as described above with reference to FIG. 5. In some cases, the memory controller 715 may read a counting information from an additional set of memory cells to determine a total number of bits in user data having a given logic state (e.g., a logic state of 1) when the user data have been encoded with the additional set of memory cells that stores the counting information corresponding to the total number. The memory controller 715 may use the total number to determine as to whether a read voltage applied to memory cells storing the user data may continue or stop while tracking a number of activated memory cells of the user data in response to the read voltage. During a read operation, the memory controller 715 may also track a number of activated memory cells of the additional set of memory cells to determine if all the memory cells of the additional set of memory cells having the logic state of 1 has been accounted for. The memory controller 715 may set a flag in the memory device 705 and extract the counting information from the additional set of memory cells. In some embodiments, the memory controller 715 stores the counting information in a register in the memory device 705 and the flag may indicate that the counting information in the register is valid.

The memory cells 720 may store information (i.e., in the form of a logical state) as described herein. In some embodiments, the memory cells 720 may include a cross-point memory array comprising 3DXP memory cells. The memory cells 720 may also be referred to as a memory medium. In some cases, the memory medium may include a 3D cross-point array of phase change memory cells.

The BIOS component 725 be a software component that includes BIOS operated as firmware, which may initialize and run various hardware components. The BIOS component 725 may also manage data flow between a processor and various other components, e.g., peripheral components 740, input/output control component, etc. The BIOS component 725 may include a program or software stored in read only memory (ROM), flash memory, or any other non-volatile memory.

The processor 730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 730 may be configured to operate a memory array using a memory controller. In other cases, a memory controller may be integrated into the processor 730. The processor 730 may be configured to execute computer-readable instructions stored in a memory to perform various functions (e.g., functions or tasks supporting auto-referenced memory cell read techniques).

The I/O controller 735 may manage input and output signals for the device 705. The I/O controller 735 may also manage peripherals not integrated into the device 705. In some cases, the I/O controller 735 may represent a physical connection or port to an external peripheral. In some cases, the I/O controller 735 may utilize an operating system such as iOS®, ANDROID®, MS-DOS®, MS-WINDOWS®, OS/2®, UNIX®, LINUX®, or another known operating system. In other cases, the I/O controller 735 may represent or interact with a modem, a keyboard, a mouse, a touchscreen, or a similar device. In some cases, the I/O controller 735 may be implemented as part of a processor. In some cases, a user may interact with the device 705 via the I/O controller 735 or via hardware components controlled by the I/O controller 735.

The peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 745 may represent a device or signal external to the device 705 that provides input to the device 705 or its components. This may include a user interface or an interface with or between other devices. In some cases, the input 745 may be managed by the I/O controller 735, and may interact with the device 705 via the peripheral components 740.

The output 750 may also represent a device or signal external to the device 705 configured to receive output from the device 705 or any of its components. Examples of the output 750 may include a display, audio speakers, a printing device, another processor or printed circuit board, etc. In some cases, the output 750 may be a peripheral element that interfaces with the device 705 via the peripheral components 740. In some cases, the output 750 may be managed by the I/O controller 735.

The components of the device 705 may include circuitry designed to carry out their functions. This may include various circuit elements, for example, conductive lines, transistors, capacitors, inductors, resistors, amplifiers, or other active or inactive elements, configured to carry out the functions described herein. The device 705 may be a computer, a server, a laptop computer, a notebook computer, a tablet computer, a mobile phone, a wearable electronic device, a personal electronic device, or the like. Or the device 705 may be a portion or aspect of such a device.

Figure 8:
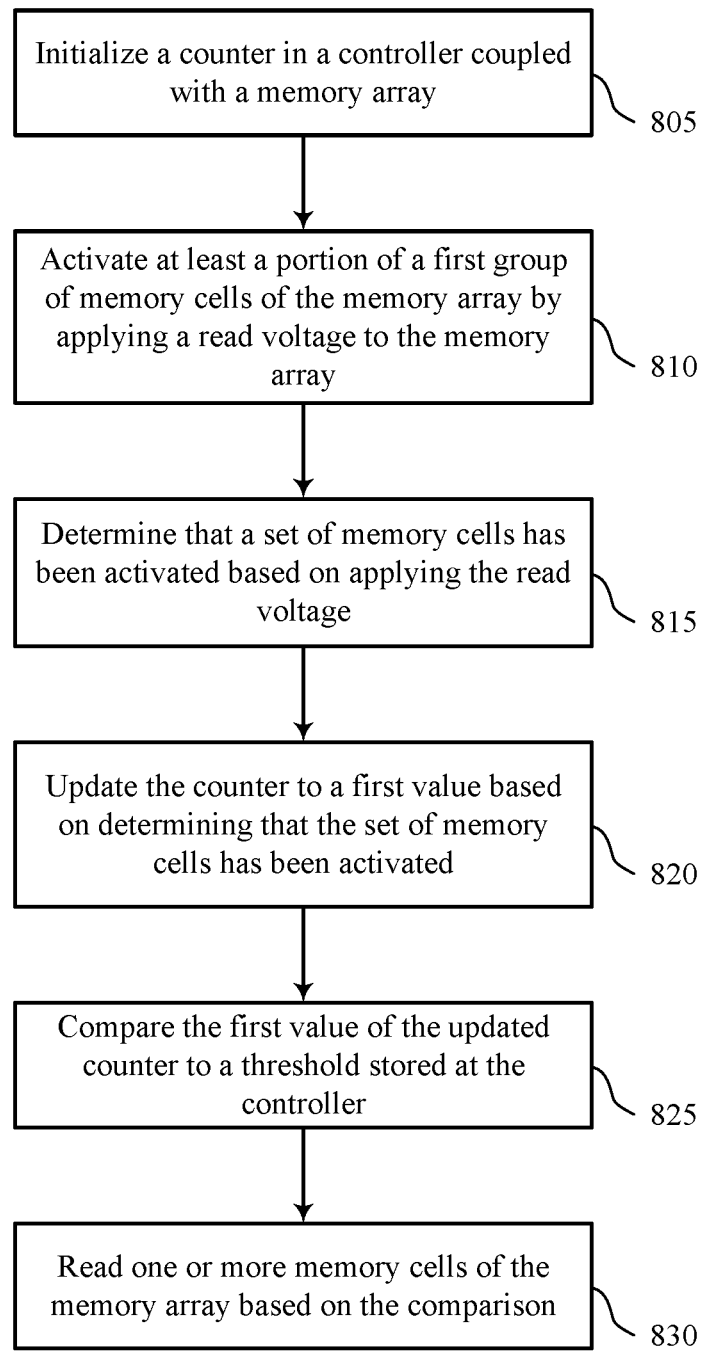
FIGS. 8 through 11 illustrate methods for auto-referenced memory cell read techniques in accordance with embodiments of the present disclosure.

FIG. 8 shows a flowchart illustrating a method 800 for auto-referenced memory cell read techniques with embodiments of the present disclosure. The operations of method 800 may be implemented by a memory device 100 or its components as described herein. For example, the operations of method 800 may be performed by a memory controller as described with reference to FIGS. 1 and 5 through 7. In some embodiments, the memory device 100 may execute a set of codes to control the functional elements of the device to perform the functions described below. Additionally or alternatively, the memory device 100 may perform aspects of the functions described below using special-purpose hardware.

At 805 the memory device 100 may initialize a counter in a controller coupled with a memory array. The operations of 805 may be performed according to the methods described herein. In certain examples, aspects of the operations of 805 may be performed by a counting component as described with reference to FIGS. 5 through 7.

At 810 the memory device 100 may activate at least a portion of a first group of memory cells of the memory array by applying a read voltage to the memory array. The operations of 810 may be performed according to the methods described herein. In certain examples, aspects of the operations of 810 may be performed by a biasing component as described with reference to FIGS. 5 through 7.

In some examples, the first group of memory cells are configured with a fixed number of memory cells independent of a total number of memory cells in the first group. In some aspects, a first half of the first group of memory cells corresponds to a first logic state and a second half of the first group of memory cells corresponds to a second logic state.

At 815 the memory device 100 may determine that a set of memory cells has been activated based at least in part on applying the read voltage. The operations of 815 may be performed according to the methods described herein. In certain examples, aspects of the operations of 815 may be performed by a detecting component as described with reference to FIGS. 5 through 7.

In some instances, each memory cell of the set of memory cells corresponds to a first logic state. In some cases, the set of memory cells is half of the first group of memory cells.

At 820 the memory device 100 may update the counter to a first value based at least in part on determining that the set of memory cells has been activated. The operations of 820 may be performed according to the methods described herein. In certain examples, aspects of the operations of 820 may be performed by a counting component as described with reference to FIGS. 5 through 7.

At 825 the memory device 100 may compare the first value of the updated counter to a threshold stored at the controller. The operations of 825 may be performed according to the methods described herein. In certain examples, aspects of the operations of 825 may be performed by a comparing component as described with reference to FIGS. 5 through 7.

At 830 the memory device 100 may read one or more memory cells of the memory array based at least in part on the comparison. The operations of 830 may be performed according to the methods described herein. In certain examples, aspects of the operations of 830 may be performed by a read component as described with reference to FIGS. 5 through 7.

After one or more memory cells of the memory array are read at 830, the memory device 100 may decode these memory cells to obtain the decoded user data bits.

An apparatus for performing the method 800 is described. The apparatus may include means for initializing a counter in a controller coupled with a memory array, means for activating at least a portion of a first group of memory cells of the memory array by applying a read voltage to the memory array, means for determining that a set of memory cells has been activated based at least in part on applying the read voltage, means for updating the counter to a first value based at least in part on determining that the set of memory cells has been activated, means for comparing the first value of the updated counter to a threshold stored at the controller, and means for reading one or more memory cells of the memory array based at least in part on the comparison.

Another apparatus for operating a memory array is described. Another apparatus for performing the method 800 is described. The apparatus may include a memory cell and a memory controller in electronic communication with the memory cell, wherein the memory controller is operable to initialize a counter in a controller coupled with a memory array, activate at least a portion of a first group of memory cells of the memory array by applying a read voltage to the memory array, determine that a set of memory cells has been activated based at least in part on applying the read voltage, update the counter to a first value based at least in part on determining that the set of memory cells has been activated, compare the first value of the updated counter to a threshold stored at the controller, and read one or more memory cells of the memory array based at least in part on the comparison.

In some examples of the method 800 and apparatus described above, the comparing further comprises: determining that the first value satisfies the threshold stored at the controller. Some examples of the method 800 and apparatus described above may further include processes, features, means, or instructions for stopping application of the read voltage to the memory array based at least in part on the determination that the first value satisfies the threshold, wherein the one or more memory cells may be read after application of the read voltage may have stopped.

In some examples of the method 800 and apparatus described above, the comparing further comprises: determining that the first value does not satisfy the threshold stored at the controller. Some examples of the method 800 and apparatus described above may further include processes, features, means, or instructions for maintaining application of the read voltage to the memory array based at least in part on the determination that the first value does not satisfy the threshold. Some examples of the method 800 and apparatus described above may further include processes, features, means, or instructions for determining that a second set of memory cells may have been activated based at least in part on maintaining application of the read voltage. Some examples of the method 800 and apparatus described above may further include processes, features, means, or instructions for updating the counter to a second value based at least in part on determining that the second set of memory cells may have been activated, wherein the one or more memory cells may be read based at least in part on updating the counter to the second value.

Some examples of the method 800 and apparatus described above may further include processes, features, means, or instructions for determining that the set of memory cells that may have been activated corresponds to a first logic state. In some examples of the method 800 and apparatus described above, the first logic state corresponds to a first set of threshold voltages that may be less than a second set of threshold voltages associated with a second logic state. In some examples of the method 800 and apparatus described above, the first group of memory cells may be configured with a predetermined number of memory cells having a first logic state. In some examples of the method 800 and apparatus described above, the threshold may be equal to the predetermined number of memory cells having the first logic state. In some examples of the method 800 and apparatus described above, the threshold may be read from a second group of memory cells of the memory array. In some examples of the method 800 and apparatus described above, the read voltage comprises a plurality of constant voltages each having a different value over a duration.

Figure 9:
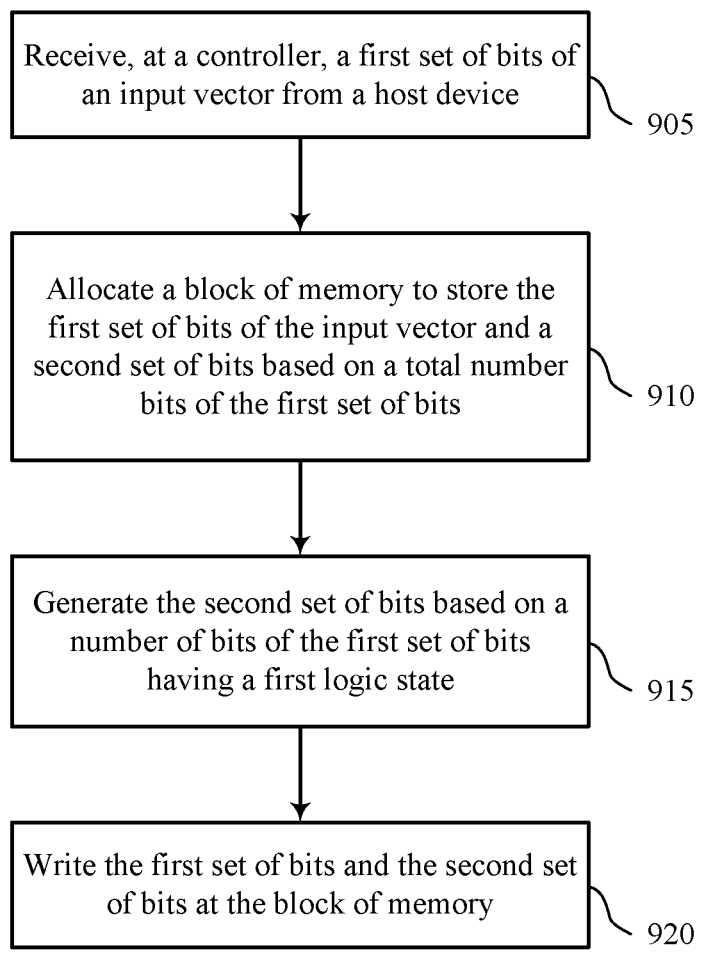

FIG. 9 shows a flowchart illustrating a method 900 for auto-referenced memory cell read techniques with embodiments of the present disclosure. The operations of method 900 may be implemented by a memory device 100 or its components as described herein. For example, the operations of method 900 may be performed by a memory controller as described with reference to FIGS. 1 and 5 through 7. In some embodiments, the memory device 100 may execute a set of codes to control the functional elements of the device to perform the functions described below. Additionally or alternatively, the memory device 100 may perform aspects of the functions described below using special-purpose hardware.

At 905 the memory device 100 may receive, at a controller, a first set of bits of an input vector from a host device. The operations of 905 may be performed according to the methods described herein. In certain examples, aspects of the operations of 905 may be performed by input/output component as described with reference to FIGS. 5 through 7.

At 910 the memory device 100 may allocate a block of memory to store the first set of bits of the input vector and a second set of bits based at least in part on a total number bits of the first set of bits. The operations of 910 may be performed according to the methods described herein. In certain examples, aspects of the operations of 910 may be performed by a programming component as described with reference to FIGS. 5 through 7.

At 915 the memory device 100 may generate the second set of bits based at least in part on a number of bits of the first set of bits having a first logic state. The operations of 915 may be performed according to the methods described herein. In certain examples, aspects of the operations of 915 may be performed by encoding component as described with reference to FIGS. 5 through 7.

At 920 the memory device 100 may write the first set of bits and the second set of bits at the block of memory. The operations of 920 may be performed according to the methods described herein. In certain examples, aspects of the operations of 920 may be performed by a programming component as described with reference to FIGS. 5 through 7.

An apparatus for performing the method 900 is described. The apparatus may include means for receiving, at a controller, a first set of bits of an input vector from a host device, means for allocating a block of memory to store the first set of bits of the input vector and a second set of bits based at least in part on a total number bits of the first set of bits, means for generating the second set of bits based at least in part on a number of bits of the first set of bits having a first logic state, and means for writing the first set of bits and the second set of bits at the block of memory.

Another apparatus for performing the method 900 is described. The apparatus may include a memory cell and a memory controller in electronic communication with the memory cell, wherein the memory controller is operable to receive, at a controller, a first set of bits of an input vector from a host device, allocate a block of memory to store the first set of bits of the input vector and a second set of bits based at least in part on a total number bits of the first set of bits, generate the second set of bits based at least in part on a number of bits of the first set of bits having a first logic state, and write the first set of bits and the second set of bits at the block of memory.

In some examples of the method 900 and apparatus described above, the second set of bits comprises multiple couples of bits representative of the number of bits of the first set of bits having the first logic state. In some examples of the method 900 and apparatus described above, generating the second set of bits comprises: determining the number of bits of the first set of bits having the first logic state. Some examples of the method 900 and apparatus described above may further include processes, features, means, or instructions for generating a set of bit values corresponding to the determined number of bits.

Figure 10:
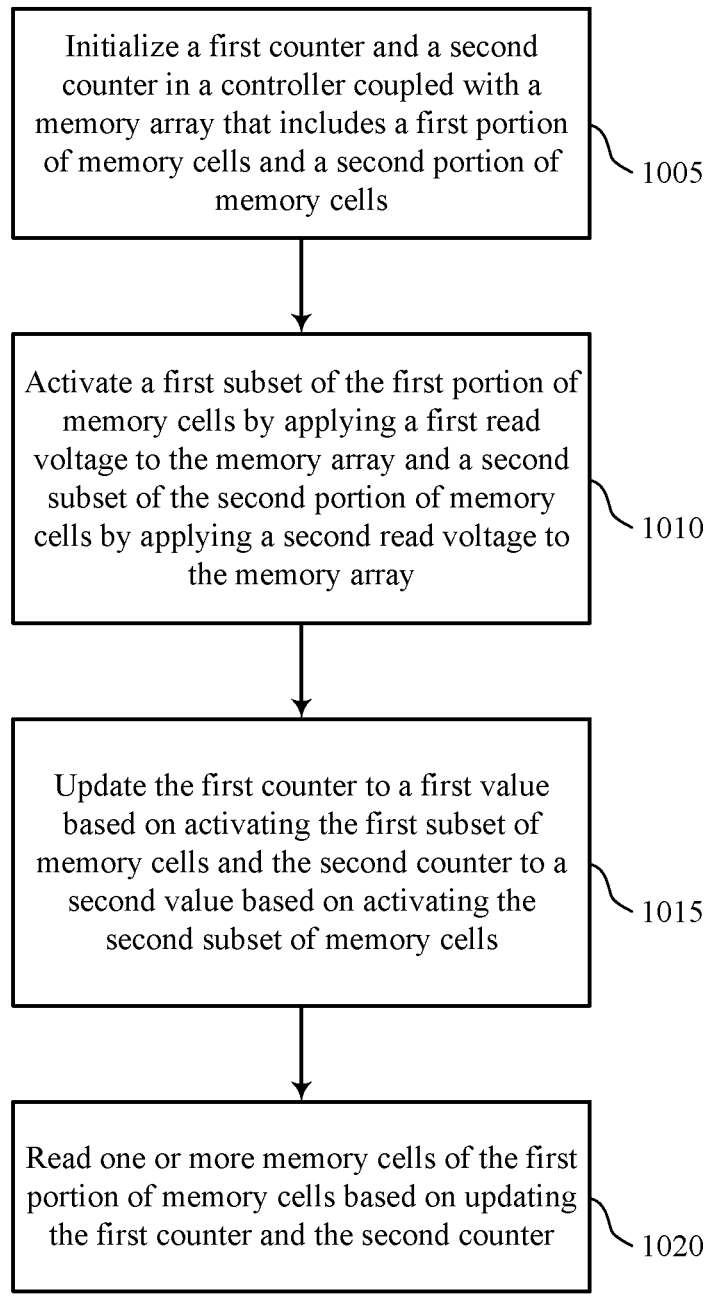

FIG. 10 shows a flowchart illustrating a method 1000 for auto-referenced memory cell read techniques with embodiments of the present disclosure. The operations of method 1000 may be implemented by a memory device 100 or its components as described herein. For example, the operations of method 1000 may be performed by a memory controller as described with reference to FIGS. 1 and 5 through 7. In some embodiments, the memory device 100 may execute a set of codes to control the functional elements of the device to perform the functions described below. Additionally or alternatively, the memory device 100 may perform aspects of the functions described below using special-purpose hardware.

At 1005 the memory device 100 may initialize a first counter and a second counter in a controller coupled with a memory array that comprises a first portion of memory cells and a second portion of memory cells. The operations of 1005 may be performed according to the methods described herein. In certain examples, aspects of the operations of 1005 may be performed by a counting component as described with reference to FIGS. 5 through 7.

At 1010 the memory device 100 may activate a first subset of the first portion of memory cells by applying a first read voltage to the memory array and a second subset of the second portion of memory cells by applying a second read voltage to the memory array. The operations of 1010 may be performed according to the methods described herein. In certain examples, aspects of the operations of 1010 may be performed by a biasing component as described with reference to FIGS. 5 through 7.

At 1015 the memory device 100 may update the first counter to a first value based at least in part on activating the first subset of memory cells and the second counter to a second value based at least in part on activating the second subset of memory cells. The operations of 1015 may be performed according to the methods described herein. In certain examples, aspects of the operations of 1015 may be performed by a counting component as described with reference to FIGS. 5 through 7.

At 1020 the memory device 100 may read one or more memory cells of the first portion of memory cells based at least in part on updating the first counter and the second counter. The operations of 1020 may be performed according to the methods described herein. In certain examples, aspects of the operations of 1020 may be performed by a read component as described with reference to FIGS. 5 through 7.

An apparatus for performing the method 1000 is described. The apparatus may include means for initializing a first counter and a second counter in a controller coupled with a memory array that comprises a first portion of memory cells and a second portion of memory cells, means for activating a first subset of the first portion of memory cells by applying a first read voltage to the memory array and a second subset of the second portion of memory cells by applying a second read voltage to the memory array, means for updating the first counter to a first value based at least in part on activating the first subset of memory cells and the second counter to a second value based at least in part on activating the second subset of memory cells, and means for reading one or more memory cells of the first portion of memory cells based at least in part on updating the first counter and the second counter.

Another apparatus for performing the method 1000 is described. The apparatus may include a memory cell and a memory controller in electronic communication with the memory cell, wherein the memory controller is operable to initialize a first counter and a second counter in a controller coupled with a memory array that comprises a first portion of memory cells and a second portion of memory cells, activate a first subset of the first portion of memory cells by applying a first read voltage to the memory array and a second subset of the second portion of memory cells by applying a second read voltage to the memory array, update the first counter to a first value based at least in part on activating the first subset of memory cells and the second counter to a second value based at least in part on activating the second subset of memory cells, and read one or more memory cells of the first portion of memory cells based at least in part on updating the first counter and the second counter.

Some examples of the method 1000 and apparatus described above may further include processes, features, means, or instructions for comparing the second value of the updated second counter to a threshold stored at the controller, wherein reading one or more memory cells of the first portion of memory cells may be based at least in part on comparing the second value of the updated second counter to the threshold.

In some examples of the method 1000 and apparatus described above, the comparing further comprises: determining that the second value satisfies the threshold stored at the controller. Some examples of the method 1000 and apparatus described above may further include processes, features, means, or instructions for stopping application of the second read voltage based at least in part on the determination that the second value satisfies the threshold. Some examples of the method 1000 and apparatus described above may further include processes, features, means, or instructions for identifying, from the second portion of memory cells, a total number of memory cells of the first portion having a first logic state based at least in part on the determination that the second value satisfies the threshold.

Some examples of the method 1000 and apparatus described above may further include processes, features, means, or instructions for determining that the first value corresponds to the identified total number. Some examples of the method 1000 and apparatus described above may further include processes, features, means, or instructions for stopping application of the first read voltage based at least in part on the determination that the first value corresponds to the identified total number, wherein the one or more memory cells of the first portion of memory cells may be read after application of the first read voltage may have stopped.

Some examples of the method 1000 and apparatus described above may further include processes, features, means, or instructions for determining that the first value does not correspond to the identified total number. Some examples of the method 1000 and apparatus described above may further include processes, features, means, or instructions for maintaining application of the first read voltage based at least in part on the determination that the first value does not correspond to the identified total number. Some examples of the method 1000 and apparatus described above may further include processes, features, means, or instructions for setting a flag in the controller based at least in part on identifying the total number of memory cells of the first portion having the first logic state.

In some examples of the method 1000 and apparatus described above, the comparing further comprises: determining that the second value does not satisfy the threshold stored at the controller. Some examples of the method 1000 and apparatus described above may further include processes, features, means, or instructions for maintaining application of the second read voltage based at least in part on the determination that the second value does not satisfy the threshold. In some examples of the method 1000 and apparatus described above, the first read voltage and the second read voltage may be a same single read voltage. In some examples of the method 1000 and apparatus described above, the first read voltage may be configured to may have a time offset with respect to the second read voltage. In some examples of the method 1000 and apparatus described above, the first read voltage may be configured to may have a different rate of voltage change with respect to the second read voltage.

Figure 11:
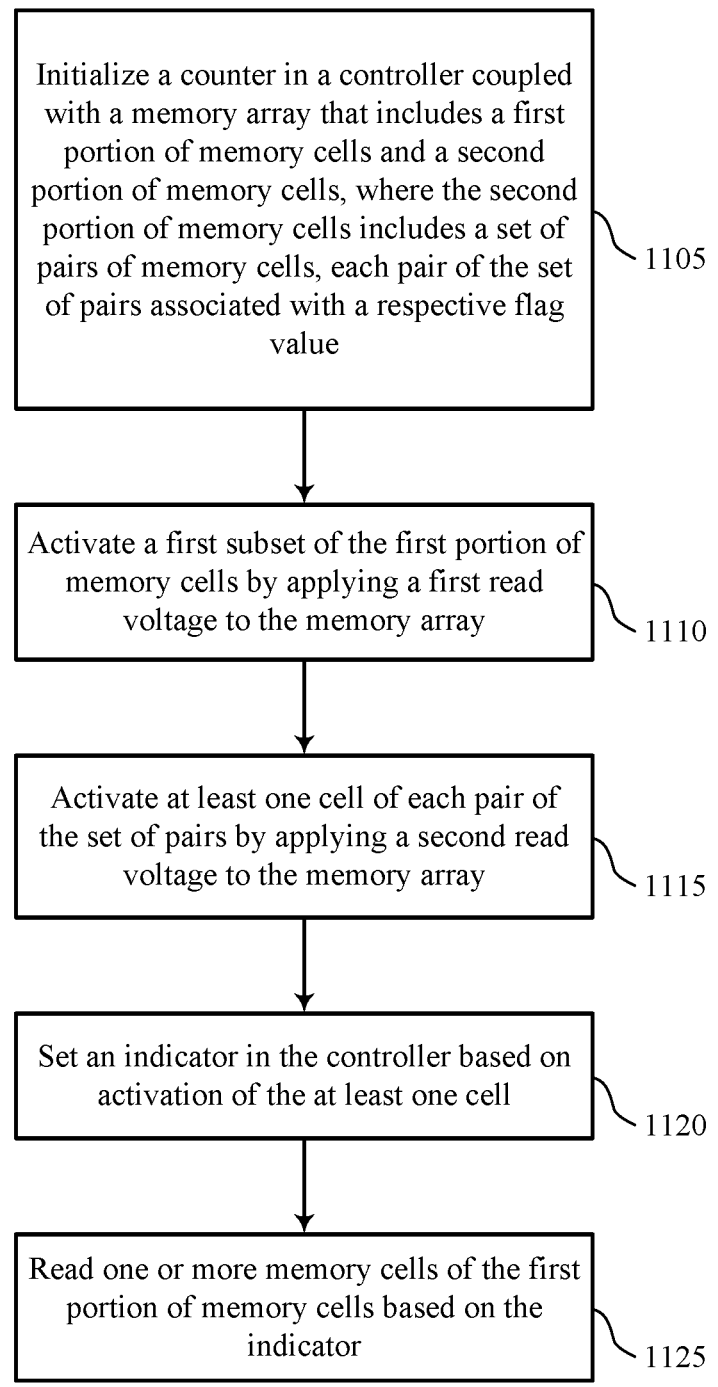

FIG. 11 shows a flowchart illustrating a method 1100 for auto-referenced memory cell read techniques with embodiments of the present disclosure. The operations of method 1100 may be implemented by a memory device 100 or its components as described herein. For example, the operations of method 1100 may be performed by a memory controller as described with reference to FIGS. 1 and 5 through 7. In some embodiments, the memory device 100 may execute a set of codes to control the functional elements of the device to perform the functions described below. Additionally or alternatively, the memory device 100 may perform aspects of the functions described below using special-purpose hardware.

At 1105 the memory device 100 may initialize a counter in a controller coupled with a memory array that comprises a first portion of memory cells and a second portion of memory cells, wherein the second portion of memory cells comprises a plurality of pairs of memory cells, each pair of the plurality of pairs associated with a respective flag value. The operations of 1105 may be performed according to the methods described herein. In certain examples, aspects of the operations of 1105 may be performed by a counting component as described with reference to FIGS. 5 through 7.

At 1110 the memory device 100 may activate a first subset of the first portion of memory cells by applying a first read voltage to the memory array. The operations of 1110 may be performed according to the methods described herein. In certain examples, aspects of the operations of 1110 may be performed by a biasing component as described with reference to FIGS. 5 through 7.

At 1115 the memory device 100 may activate at least one cell of each pair of the plurality of pairs by applying a second read voltage to the memory array. The operations of 1115 may be performed according to the methods described herein. In certain examples, aspects of the operations of 1115 may be performed by a biasing component as described with reference to FIGS. 5 through 7.

At 1120 the memory device 100 may set an indicator in the controller based at least in part on activation of the at least one cell. The operations of 1120 may be performed according to the methods described herein. In certain examples, aspects of the operations of 1120 may be performed by a flag component as described with reference to FIGS. 5 through 7.

At 1125 the memory device 100 may read one or more memory cells of the first portion of memory cells based at least in part on the indicator. The operations of 1125 may be performed according to the methods described herein. In certain examples, aspects of the operations of 1125 may be performed by a read component as described with reference to FIGS. 5 through 7.

An apparatus for performing the method 1100 is described. The apparatus may include means for initializing a counter in a controller coupled with a memory array that comprises a first portion of memory cells and a second portion of memory cells, wherein the second portion of memory cells comprises a plurality of pairs of memory cells, each pair of the plurality of pairs associated with a respective flag value, means for activating a first subset of the first portion of memory cells by applying a first read voltage to the memory array, means for activating at least one cell of each pair of the plurality of pairs by applying a second read voltage to the memory array, means for setting an indicator in the controller based at least in part on activation of the at least one cell, and means for reading one or more memory cells of the first portion of memory cells based at least in part on the indicator.

Another apparatus for performing the method 1100 is described. The apparatus may include a memory cell and a memory controller in electronic communication with the memory cell, wherein the memory controller is operable to initialize a counter in a controller coupled with a memory array that comprises a first portion of memory cells and a second portion of memory cells, wherein the second portion of memory cells comprises a plurality of pairs of memory cells, each pair of the plurality of pairs associated with a respective flag value, activate a first subset of the first portion of memory cells by applying a first read voltage to the memory array, activate at least one cell of each pair of the plurality of pairs by applying a second read voltage to the memory array, set an indicator in the controller based at least in part on activation of the at least one cell, and read one or more memory cells of the first portion of memory cells based at least in part on the indicator.

In some examples of the method 1100 and apparatus described above, setting the indicator comprises: toggling the respective flag value of each pair of the plurality of pairs from a first flag value to a second flag value based at least in part on activation of the at least one cell.

Some examples of the method 1100 and apparatus described above may further include processes, features, means, or instructions for determining, based at least in part on a set of values of the second portion of memory cells after activation of the at least one cell, a total number of memory cells of the first portion having a first logic state. Some examples of the method 1100 and apparatus described above may further include processes, features, means, or instructions for updating the counter to a first count value based at least in part on activation of the first subset of memory cells. Some examples of the method 1100 and apparatus described above may further include processes, features, means, or instructions for comparing the first count value to the determined total number, wherein one or more memory cells of the first portion of memory cells may be read based at least in part on the comparison.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge-Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   initializing a first counter and a second counter in a controller coupled with a memory array that comprises a first portion of memory cells and a second portion of memory cells;
   activating a first subset of the first portion of memory cells by applying a first read voltage to the memory array and a second subset of the second portion of memory cells by applying a second read voltage to the memory array;
   updating the first counter to a first value based at least in part on activating the first subset of the first portion of memory cells and the second counter to a second value based at least in part on activating the second subset of the second portion of memory cells; and
   reading one or more memory cells of the first portion of memory cells based at least in part on updating the first counter and the second counter.

2. The method of claim 1, further comprising:
   comparing the second value of the updated second counter to a threshold, wherein reading one or more memory cells of the first portion of memory cells is based at least in part on comparing the second value of the updated second counter to the threshold.

3. The method of claim 2, wherein the comparing further comprises:
   determining that the second value satisfies the threshold;
   stopping application of the second read voltage based at least in part on the determination that the second value satisfies the threshold; and
   identifying, from the second portion of memory cells, a total number of memory cells of the first portion having a first logic state based at least in part on the determination that the second value satisfies the threshold.

4. The method of claim 3, further comprising:
   determining that the first value corresponds to the identified total number; and
   stopping application of the first read voltage based at least in part on the determination that the first value corresponds to the identified total number, wherein the one or more memory cells of the first portion of memory cells are read after application of the first read voltage has stopped.

5. The method of claim 3, further comprising:
   determining that the first value does not correspond to the identified total number; and
   maintaining application of the first read voltage based at least in part on the determination that the first value does not correspond to the identified total number.

6. The method of claim 3, further comprising:
   setting a flag in the controller based at least in part on identifying the total number of memory cells of the first portion having the first logic state.

7. The method of claim 2, wherein the comparing further comprises:
   determining that the second value does not satisfy the threshold; and
   maintaining application of the second read voltage based at least in part on the determination that the second value does not satisfy the threshold.

8. The method of claim 1, wherein the first read voltage and the second read voltage are a same single read voltage.

9. The method of claim 1, wherein the first read voltage is configured to have a time offset with respect to the second read voltage.

10. The method of claim 1, wherein the first read voltage is configured to have a different rate of voltage change with respect to the second read voltage.

11. An apparatus, comprising:
a memory array that comprises a first portion of memory cells and a second portion of memory cells; and
a controller coupled with the memory array and operable to cause the apparatus to:
initialize a first counter and a second counter;
activate a first subset of the first portion of memory cells by applying a first read voltage to the memory array and a second subset of the second portion of memory cells by applying a second read voltage to the memory array;
update the first counter to a first value based at least in part on activating the first subset of the first portion of memory cells and the second counter to a second value based at least in part on activating the second subset of the second portion of memory cells; and
read one or more memory cells of the first portion of memory cells based at least in part on updating the first counter and the second counter.

12. The apparatus of claim 11, wherein the controller is further operable to cause the apparatus to:
compare the second value of the updated second counter to a threshold, wherein reading one or more memory cells of the first portion of memory cells is based at least in part on comparing the second value of the updated second counter to the threshold.

13. The apparatus of claim 12, wherein the controller is further operable to cause the apparatus to:
determine that the second value satisfies the threshold;
stop application of the second read voltage based at least in part on the determination that the second value satisfies the threshold; and
identify, from the second portion of memory cells, a total number of memory cells of the first portion having a first logic state based at least in part on the determination that the second value satisfies the threshold, wherein the comparing is based at least in part on the identifying.

14. The apparatus of claim 13, wherein the controller is further operable to cause the apparatus to:
determine that the first value corresponds to the identified total number; and
stop application of the first read voltage based at least in part on the determination that the first value corresponds to the identified total number, wherein the one or more memory cells of the first portion of memory cells are read after application of the first read voltage has stopped.

15. The apparatus of claim 13, wherein the controller is further operable to cause the apparatus to:
determine that the first value does not correspond to the identified total number; and
maintain application of the first read voltage based at least in part on the determination that the first value does not correspond to the identified total number.

16. The apparatus of claim 13, wherein the controller is further operable to cause the apparatus to:
set a flag in the controller based at least in part on identifying the total number of memory cells of the first portion having the first logic state.

17. The apparatus of claim 11, wherein the first read voltage is configured to have a time offset with respect to the second read voltage.

18. An apparatus, comprising:
a memory array that comprises a first portion of memory cells and a second portion of memory cells;
a biasing component coupled with the memory array and operable to activate a first subset of the first portion of memory cells by applying a first read voltage to the memory array and a second subset of the second portion of memory cells by applying a second read voltage to the memory array;
a controller coupled with the memory array and operable to cause the apparatus to:
initialize a first counter and a second counter in the controller; and
update the first counter to a first value based at least in part on the biasing component activating the first subset of the first portion of memory cells and the second counter to a second value based at least in part on activating the second subset of the second portion of memory cells; and
a sense component operable to read one or more memory cells of the first portion of memory cells based at least in part on the first counter and the second counter being updated.

19. The apparatus of claim 18, wherein the controller is further operable to:
compare the second value of the updated second counter to a threshold, wherein reading one or more memory cells of the first portion of memory cells is based at least in part on comparing the second value of the updated second counter to the threshold.

20. The apparatus of claim 19, wherein:
the controller is further operable to determine that the second value satisfies the threshold;
the biasing component is further operable to stop application of the second read voltage based at least in part on the determination that the second value satisfies the threshold; and
the controller is further operable to identify, from the second portion of memory cells, a total number of memory cells of the first portion having a first logic state based at least in part on the determination that the second value satisfies the threshold.

* * * * *